(12) United States Patent
Chien

(10) Patent No.: US 11,646,280 B2
(45) Date of Patent: May 9, 2023

(54) METHOD FOR FABRICATING SEMICONDUCTOR DEVICE

(71) Applicant: NANYA TECHNOLOGY CORPORATION, New Taipei (TW)

(72) Inventor: Jung-Hsing Chien, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 53 days.

(21) Appl. No.: 17/517,560

(22) Filed: Nov. 2, 2021

(65) Prior Publication Data

US 2022/0059478 A1 Feb. 24, 2022

Related U.S. Application Data

(62) Division of application No. 16/674,367, filed on Nov. 5, 2019, now abandoned.

(51) Int. Cl.
*H01L 23/00* (2006.01)
*H01L 21/02* (2006.01)

(52) U.S. Cl.
CPC ........ *H01L 24/05* (2013.01); *H01L 21/02068* (2013.01); *H01L 23/562* (2013.01); *H01L 24/03* (2013.01); *H01L 2224/0212* (2013.01); *H01L 2224/02351* (2013.01); *H01L 2224/03916* (2013.01); *H01L 2224/05017* (2013.01); *H01L 2224/05073* (2013.01); *H01L 2224/05076* (2013.01); *H01L 2224/05082* (2013.01); *H01L 2224/05557* (2013.01); *H01L 2224/05573* (2013.01)

(58) Field of Classification Search
None
See application file for complete search history.

(56) References Cited

U.S. PATENT DOCUMENTS 9,202,758 B1 * 12/2015 Besser .............. H01L 21/76843
2008/0081468 A1 * 4/2008 Arakawa .......... H01L 21/76835
438/674

FOREIGN PATENT DOCUMENTS

JP 2004193299 A 12/2002

* cited by examiner

*Primary Examiner* — Evren Seven
(74) *Attorney, Agent, or Firm* — Xuan Zhang

(57) ABSTRACT

The present application discloses a method for fabricating a semiconductor device. The method for fabricating a semiconductor device includes providing a substrate, forming a pad structure above the substrate, and forming a top groove on a top surface of the pad structure.

14 Claims, 38 Drawing Sheets

METHOD FOR FABRICATING SEMICONDUCTOR DEVICE

CROSS-REFERENCE TO RELATED APPLICATION

This application is a divisional application of U.S. non-provisional application Ser. No. 16/674,367 filed Nov. 5, 2019, which is incorporated herein by reference in its entirety.

TECHNICAL FIELD

The present disclosure relates to a method for fabricating a semiconductor device, and more particularly, to a method for fabricating a semiconductor device with a groove.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process and are continuously increasing. Therefore, challenges remain in achieving improved quality, yield, performance and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a pad structure positioned above the substrate, and a top groove positioned on a top surface of the pad structure.

In some embodiments, the pad structure comprises a bottom pad positioned above the substrate and a top pad positioned on the bottom pad, and the top groove is positioned on a top surface of the top pad.

In some embodiments, the semiconductor device further comprises a bottom groove positioned on a top surface of the bottom pad, wherein the top pad is positioned on the bottom groove and the bottom pad.

In some embodiments, the semiconductor device further comprises two spacers attached to two sides of the pad structure.

In some embodiments, the top groove is adjacent to an edge of the top surface of the top pad.

In some embodiments, the pad structure comprises a bottom pad positioned above the substrate, a middle pad positioned on the bottom pad, and a top pad positioned on the middle pad, and the top groove is positioned on a top surface of the top pad.

In some embodiments, the semiconductor device further comprises a bottom groove positioned on a top surface of the bottom pad and a middle groove positioned on a top surface of the middle pad, wherein the middle pad is positioned on the bottom groove and the bottom pad, and the top pad is positioned on the middle groove and the middle pad.

In some embodiments, the semiconductor device further comprises a redistribution layer positioned above the substrate, wherein the pad structure is positioned on the redistribution layer.

In some embodiments, the pad structure comprises a bottom pad positioned on the redistribution layer and a top pad positioned on the bottom pad, and the top groove is positioned on a top surface of the top pad.

In some embodiments, the semiconductor device further comprises a base groove positioned on a top surface of the redistribution layer and a bottom groove positioned on a top surface of the bottom pad and directly above the base groove, wherein the bottom pad is positioned on the base groove and the redistribution layer, the top pad is positioned on the bottom groove and the bottom pad, and the top groove is directly above the bottom groove.

In some embodiments, a ratio of a depth of the top groove and a thickness of the pad structure is between 1:10 and 1:20.

In some embodiments, the semiconductor device further comprises a stress relief structure positioned directly below the pad structure.

In some embodiments, the stress relief structure comprises a conductive frame positioned directly below the pad structure and a plurality of insulating segments positioned within the conductive frame.

In some embodiments, the semiconductor device further comprises a stress-buffering layer positioned between the stress relief structure and the pad structure, wherein the stress-buffering layer is formed of a material having a coefficient of thermal expansion of less than about 20 ppm/° C. and a Young's Modulus of less than about 15 GPa.

Another aspect of the present disclosure provides a method for fabricating a semiconductor device including providing a substrate, forming a pad structure above the substrate, and forming a top groove on a top surface of the pad structure.

In some embodiments, the method for fabricating the semiconductor device further comprises: forming a plurality of passivation layers above the substrate; and forming a pad opening penetrating through the plurality of passivation layers;

In some embodiments, wherein the pad structure is formed in the pad opening.

In some embodiments, the method for fabricating the semiconductor device further comprises: performing a passivation process comprising soaking the pad opening with a precursor, wherein the precursor is dimethylaminotrimethylsilane or tetramethylsilane.

In some embodiments, the method for fabricating the semiconductor device further comprises: performing a cleaning process, wherein the cleaning process comprises applying a remote plasma to the pad opening.

Due to the design of the semiconductor device of the present disclosure, the top groove may serve as a guide for a probe tip to prevent the slipping probe tip from moving out of the top groove. Therefore, even if the slippage of the probe tip occurs, the surrounding environment of the semiconductor may remain intact. As a result, the quality, yield, and performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
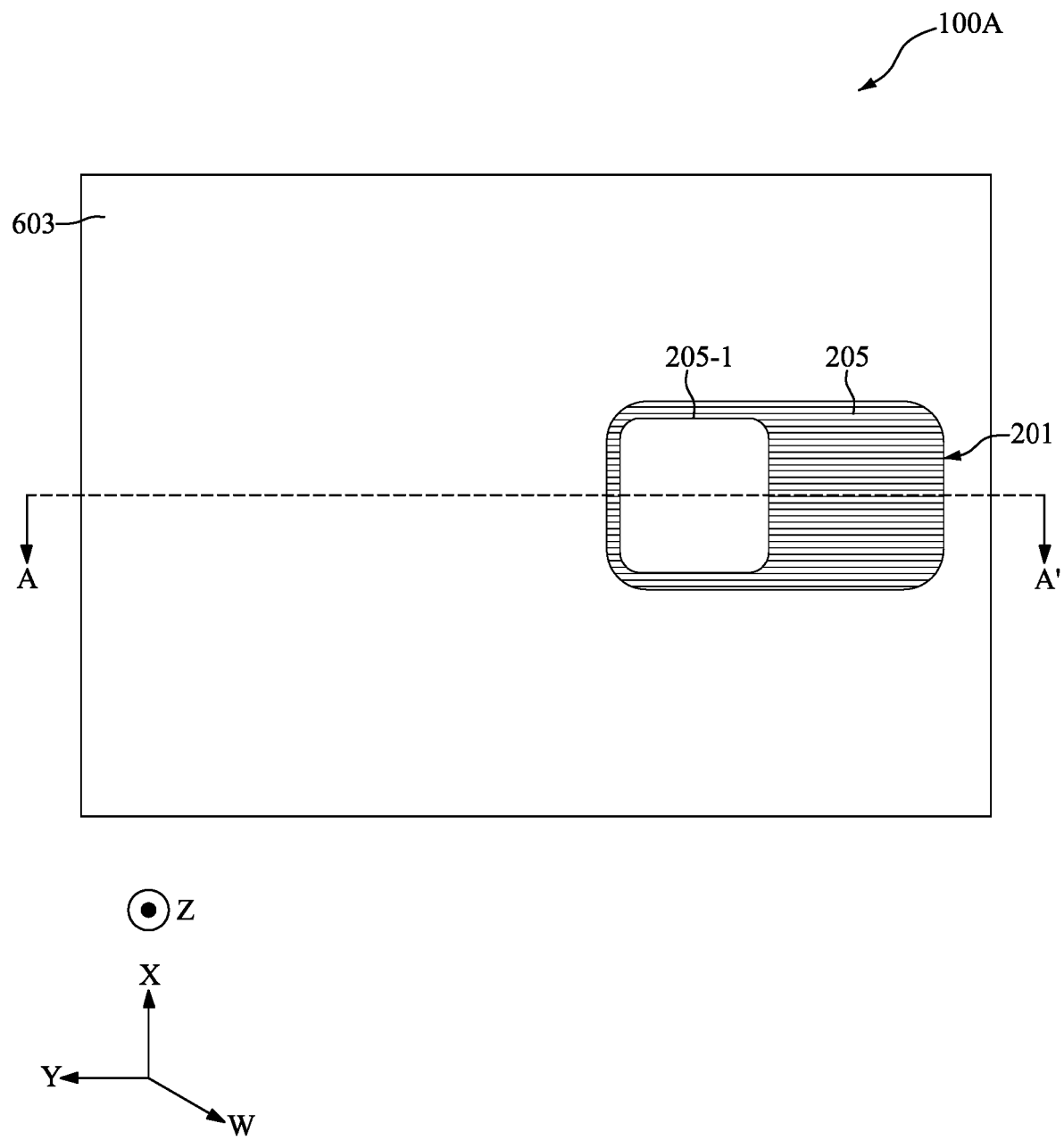
FIG. 1 illustrates, in a schematic top-view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
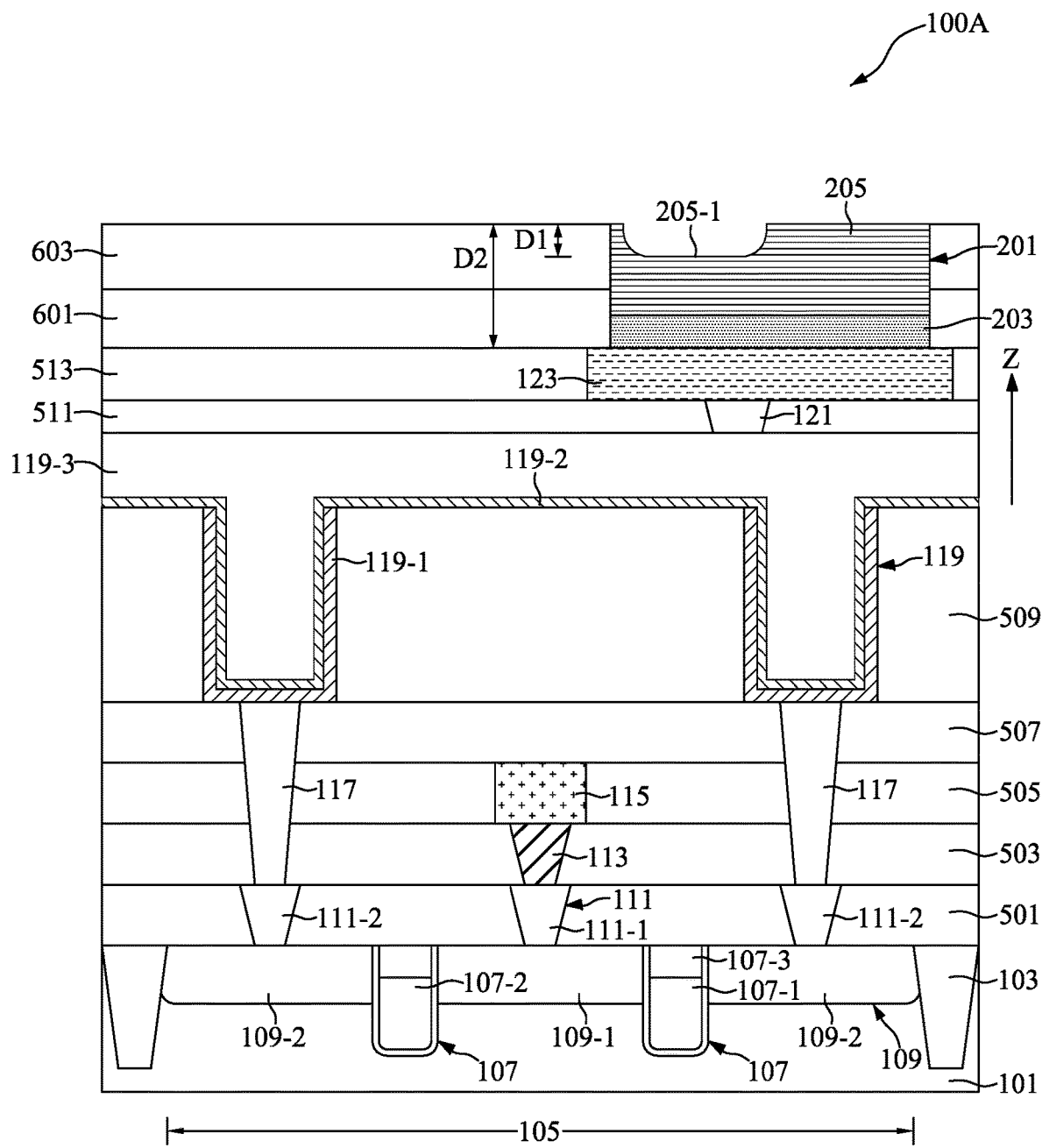
FIG. 2 is a schematic cross-sectional diagram taken along a line A-A' in FIG. 1.

FIG. 1 illustrates, in a schematic top-view diagram, a semiconductor device 100A in accordance with one embodiment of the present disclosure. FIG. 2 illustrates the semiconductor device 100A in accordance with one embodiment of the present disclosure in a schematic cross-sectional diagram taken along a line A-A' in FIG. 1. Some elements of the semiconductor device 100A of the present disclosure are not shown in FIG. 1 for clarity.

With reference to FIGS. 1 and 2, in the embodiment depicted, the semiconductor device 100A may include a substrate 101, an isolation layer 103, a plurality of word lines 107, a plurality of doped regions 109, a plurality of contacts 111, a plurality of bit line contacts 113, a plurality of bit lines 115, a plurality of plugs 117, a plurality of capacitor structures 119, a first conductive via 121, a first conductive layer 123, a plurality of insulating films, a plurality of passivation layers, and a first pad structure 201.

With reference to FIGS. 1 and 2, in the embodiment depicted, the substrate 101 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials. The isolation layer 103 may be disposed in an upper portion of the substrate 101. (Two isolation layers 103 are shown in the cross-sectional diagram in FIG. 2, but other quantities of isolation layers may be used in other embodiments.) The isolation layer 103 may be formed of, for example, an insulating material such as silicon oxide, silicon nitride, silicon oxynitride, silicon nitride oxide, or fluoride-doped silicate. The isolation layer 103 may define a plurality of active regions 105 of the substrate 101.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 1 and 2, in the embodiment depicted, the plurality of word lines 107 may be disposed in the substrate 101 and separated from each other. Each of the plurality of active regions 105 may intersect two of the plurality of word lines 107. The plurality of word lines 107 may include a plurality of word line insulating layers 107-1 inwardly disposed in the substrate 101, a plurality of word line electrodes 107-2 respectively correspondingly disposed on the plurality of word line insulating layers 107-1, and a plurality of word line capping layers 107-3 respectively correspondingly disposed on the plurality of word line electrodes 107-2.

With reference to FIGS. 1 and 2, in the embodiment depicted, the plurality of word line insulating layers 107-1 may be formed of, for example, an insulating material having a dielectric constant of about 4.0 or greater. (All dielectric constants mentioned herein are relative to a vacuum unless otherwise noted.) The insulating material having a dielectric constant of about 4.0 or greater may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or a mixture thereof. Alternatively, in another embodiment, the insulating material may be silicon oxide, silicon nitride, silicon oxynitride, silicon nitride oxide, or the like.

With reference to FIGS. 1 and 2, in the embodiment depicted, the plurality of word line electrodes 107-2 may be formed of, for example, a conductive material such as doped polysilicon, silicon germanium, metal, metal alloy, metal silicide, metal nitride, metal carbide, or a combination including multilayers thereof. The metal may be aluminum, copper, tungsten, or cobalt. The metal silicide may be nickel silicide, platinum silicide, titanium silicide, molybdenum silicide, cobalt silicide, tantalum silicide, tungsten silicide, or the like. The plurality of word line capping layers 107-3 may be formed of, for example, an insulating material having a dielectric constant of about 4.0 or greater.

With reference to FIGS. 1 and 2, in the embodiment depicted, the plurality of doped regions 109 may be disposed in the substrate 101. The plurality of doped regions 109 may be doped with a dopant such as phosphorus, arsenic, antimony, or boron. The plurality of doped regions 109 may include a first doped region 109-1 and two second doped regions 109-2. The first doped region 109-1 may be disposed between two of the plurality of word lines 107. Each of the two second doped regions 109-2 may be respectively correspondingly disposed between one of the plurality of word lines 107 and the isolation layer 103.

With reference to FIGS. 1 and 2, in the embodiment depicted, the plurality of insulating films may be disposed on the substrate 101. The plurality of insulating films may be formed of, for example, silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, xerogel, aerogel, amorphous fluorinated carbon, organo silicate glass, parylene, bis-benzocyclobutenes, polyimide, porous polymeric material, or a combination thereof, but are not limited thereto. The plurality of insulating films may all be formed of a same material, but are not limited thereto. The plurality of insulating films may include a first insulating film 501, a second insulating film 503, a third insulating film 505, a fourth insulating film 507, a fifth insulating film 509, a sixth insulating film 511, and a seventh insulating film 513.

With reference to FIGS. 1 and 2, in the embodiment depicted, the first insulating film 501 may be disposed on the substrate 101. The plurality of contacts 111 may be disposed in the first insulating film 501. The plurality of contacts 111 may be formed of a conductive material such as doped polysilicon, metal, metal nitride, or metal silicide. For each of the plurality of active regions 105, the plurality of contacts 111 may include a first contact 111-1 and two second contacts 111-2. The first contact 111-1 may be disposed on the first doped region 109-1. The two second contacts 111-2 may be respectively correspondingly disposed on the two second doped regions 109-2.

With reference to FIGS. 1 and 2, in the embodiment depicted, the second insulating film 503 may be disposed on the first insulating film 501. The plurality of bit line contacts 113 may be disposed in the second insulating film 503 and in the plurality of active regions 105. (Only one bit line contact 113 is shown in the cross-sectional diagram in FIG. 2.) For each of the plurality of active regions 105, the bit line contact 113 may be disposed on the first contact 111-1. The plurality of bit line contacts 113 may be formed of a same material as the first contact 111-1, but are not limited thereto. The third insulating film 505 may be disposed on the second insulating film 503. The plurality of bit lines 115 may be disposed in the third insulating film 505. (Only one bit line 115 is shown in the cross-sectional diagram in FIG. 2.) For each of the plurality of active regions 105, the bit line 115 may be disposed on the corresponding bit line contact 113. The plurality of bit lines 115 may be formed of a conductive material such as tungsten, aluminum, copper, nickel, or cobalt.

With reference to FIGS. 1 and 2, in the embodiment depicted, the fourth insulating film 507 may be disposed on the third insulating film 505. The plurality of capacitor plugs 117 may be disposed so as to penetrate through the fourth insulating film 507, the third insulating film 505, and the second insulating film 503. For each of the plurality of active regions 105, two of the plurality of capacitor plugs 117 may be respectively correspondingly disposed on the two second contacts 111-2. The plurality of capacitor plugs 117 may be formed of doped polysilicon, titanium, titanium nitride, tantalum, tantalum nitride, tungsten, copper, aluminum or aluminum alloy. The fifth insulating film 509 may be disposed on the fourth insulating film 507. The plurality of capacitor structures 119 may be disposed in the fifth insulating film 509 and respectively correspondingly on the plurality of capacitor plugs 117.

With reference to FIGS. 1 and 2, in the embodiment depicted, the plurality of capacitor structures 119 may include a plurality of capacitor bottom electrodes 119-1 inwardly disposed in the fifth insulating film 509, a capacitor insulating layer 119-2 disposed on the plurality of capacitor bottom electrodes 119-1, and a capacitor top electrode 119-3 disposed on the capacitor insulating layer 119-2. The plurality of capacitor bottom electrodes 119-1 may be formed of doped polysilicon, metal, or metal silicide. The capacitor insulating layer 119-2 may be formed of a single layer including an insulating material having a dielectric constant of about 4.0 or greater. The capacitor top electrode 119-3 may be formed of doped polysilicon or metal. Alternatively, in another embodiment, the capacitor insulating layer 119-2 may be formed of a stacked layer consisting of silicon oxide, silicon nitride, and silicon oxide.

With reference to FIGS. 1 and 2, in the embodiment depicted, the sixth insulating film 511 may be disposed on the capacitor top electrode 119-3. The seventh insulating film 513 may be disposed on the sixth insulating film 511. The first conductive via 121 may be disposed in the sixth insulating film 511 and on the capacitor top electrode 119-3. The first conductive via 121 may be formed of, for example, metal, metal alloy, silicate, silicide, polysilicon, amorphous silicon, or any other semiconductor-compatible conductive material. The first conductive layer 123 may be disposed in the seventh insulating film 513 and on the first conductive via 121. The first conductive layer 123 may be formed of, for example, a conductive material such as doped polysilicon, metal, metal nitride, or metal silicide.

With reference to FIGS. 1 and 2, in the embodiment depicted, the plurality of passivation layers may be disposed on the seventh insulating film 513. The plurality of passivation layers may include a first passivation layer 601 and a second passivation layer 603. The first passivation layer 601 may be disposed on the seventh insulating film 513. The first passivation layer 601 may be formed of, for example, silicon oxide or phosphosilica glass. The second passivation layer 603 may be disposed on the first passivation layer 601 and formed of, for example, silicon nitride, silicon oxynitride, or silicon oxide nitride. The first passivation layer 601 may serve as a stress buffer between the second passivation layer 603 and the seventh insulating film 513. The second passivation layer 603 may serve as a high vapor barrier in order to prevent moisture from entering from above.

With reference to FIGS. 1 and 2, in the embodiment depicted, the first pad structure 201 may be disposed in the first passivation layer 601 and the second passivation layer 603. The first pad structure 201 may be disposed on the first conductive layer 123 and electrically connected to the first conductive layer 123. The first pad structure 201 may include a first bottom pad 203, a first top pad 205, and a first top groove 205-1.

With reference to FIGS. 1 and 2, in the embodiment depicted, the first bottom pad 203 may be disposed in the first passivation layer 601 and on the first conductive layer 123. The first bottom pad 203 may be electrically connected to the first conductive layer 123. A thickness of the first bottom pad 203 may be less than a thickness of the first passivation layer 601. The first bottom pad 203 may include nickel. The first top pad 205 may be disposed in the first passivation layer 601 and the second passivation layer 603. The first top pad 205 may be disposed on the first bottom pad 203 and electrically connected to the first bottom pad 203. A top surface of the first top pad 205 may be even with a top surface of the second passivation layer 603. The top bonding layer 605 may include palladium, cobalt, or a combination thereof. The first top groove 205-1 may be inwardly disposed on the top surface of the first top pad 205. The first top groove 205-1 may be adjacent to an edge of the top surface of the first top pad 205 in a top-view diagram. The edge of the top surface of the first top pad 205 may be located closer to a center area of the semiconductor device 100A which includes logic elements. In other words, the first top groove 205-1 may be asymmetrically disposed on the top surface of the first top pad 205. A ratio of a depth D1 of the first top groove 205-1 and a thickness D2 of the first pad structure 201 may be between 1:10 and 1:20.

In order to ensure the quality of a semiconductor device, an inspection process may be performed by using a probe tip configured on a cantilever to directly contact a top surface of a pad structure and measure electrical signal. However, a native oxide layer may be formed on the top surface of the pad structure due to air exposure of the pad structure; therefore, while performing the inspection process, the probe tip may have to penetrate the native oxide layer to measure the electrical signal. In addition, during the operation of the probe tip, a slippage may occur, and the penetrating probe tip may slip off the top surface of the pad structure and damage the surrounding passivation layer or insulating layer. Moisture may enter the interior of the semiconductor device from the damaged passivation layer or insulating layer and the intactness of the semiconductor device may be lost. As a result, the semiconductor device may become more fragile and the quality, yield, and performance of the semiconductor device may be affected.

With reference to FIGS. 1 and 2, in the embodiment depicted, when a slippage of a probe tip occurs, the first top groove 205-1 may serve as a guide for the probe tip to prevent the slipping probe tip from moving out of the first top groove 205-1. Therefore, even if the slippage of the probe tip occurs, the surrounding passivation layer may remain intact. As a result, the quality, yield, and performance of the semiconductor device 100A may be improved. In addition, the first top groove 205-1 may be disposed close to the edge of the top surface of the first top pad 205, which is located close to the center area of the semiconductor device 100A. The center area of the semiconductor device 100A may include logic elements. In other words, the first top groove 205-1 may be disposed close to the logic elements of the semiconductor device 100A and may effectively prevent a probe tip from slipping toward the center area of the semiconductor device 100A.

Figure 3:
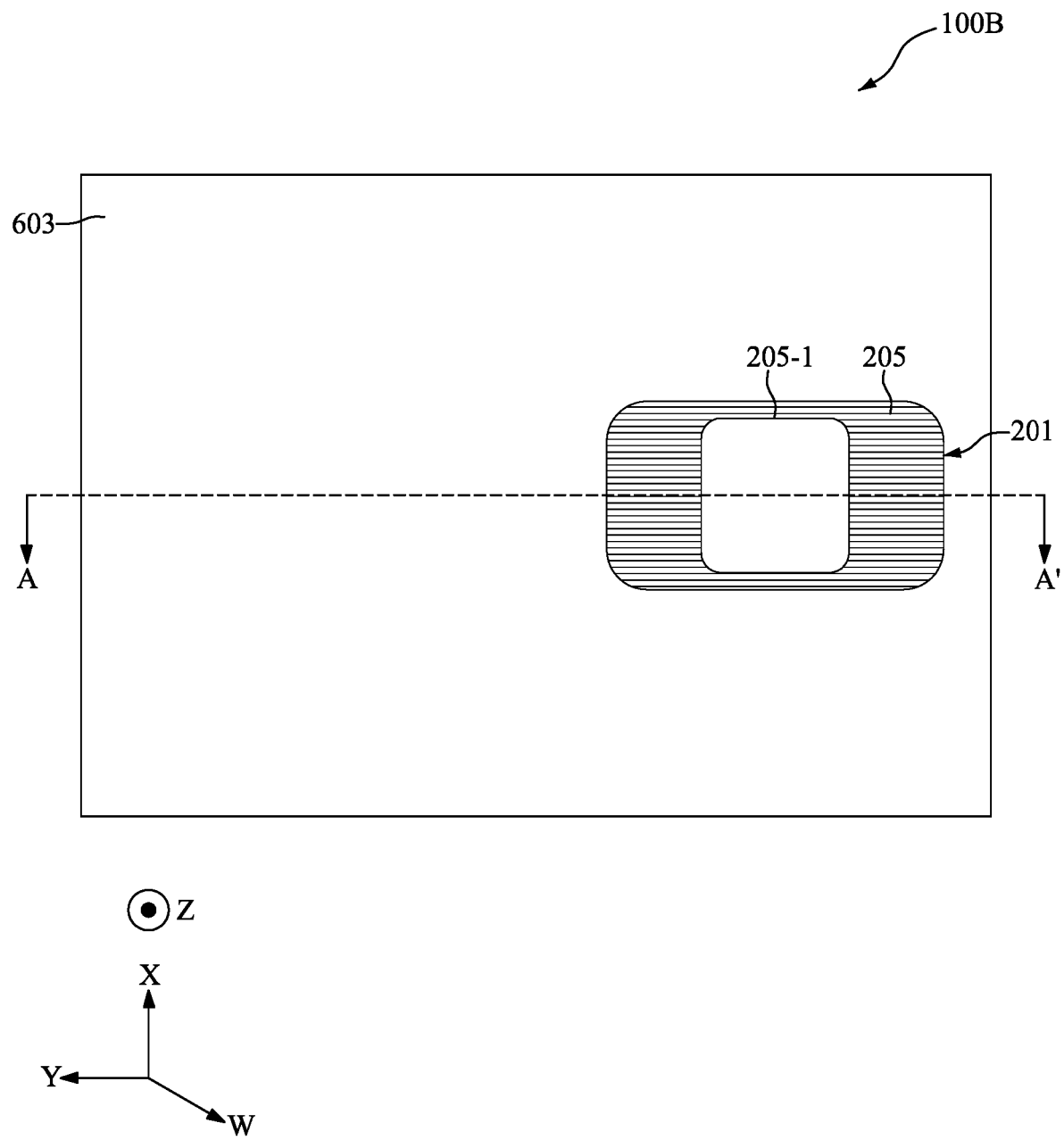
FIG. 3 illustrates, in a schematic top-view diagram, a semiconductor device in accordance with one embodiment of the present disclosure.
Figure 4:
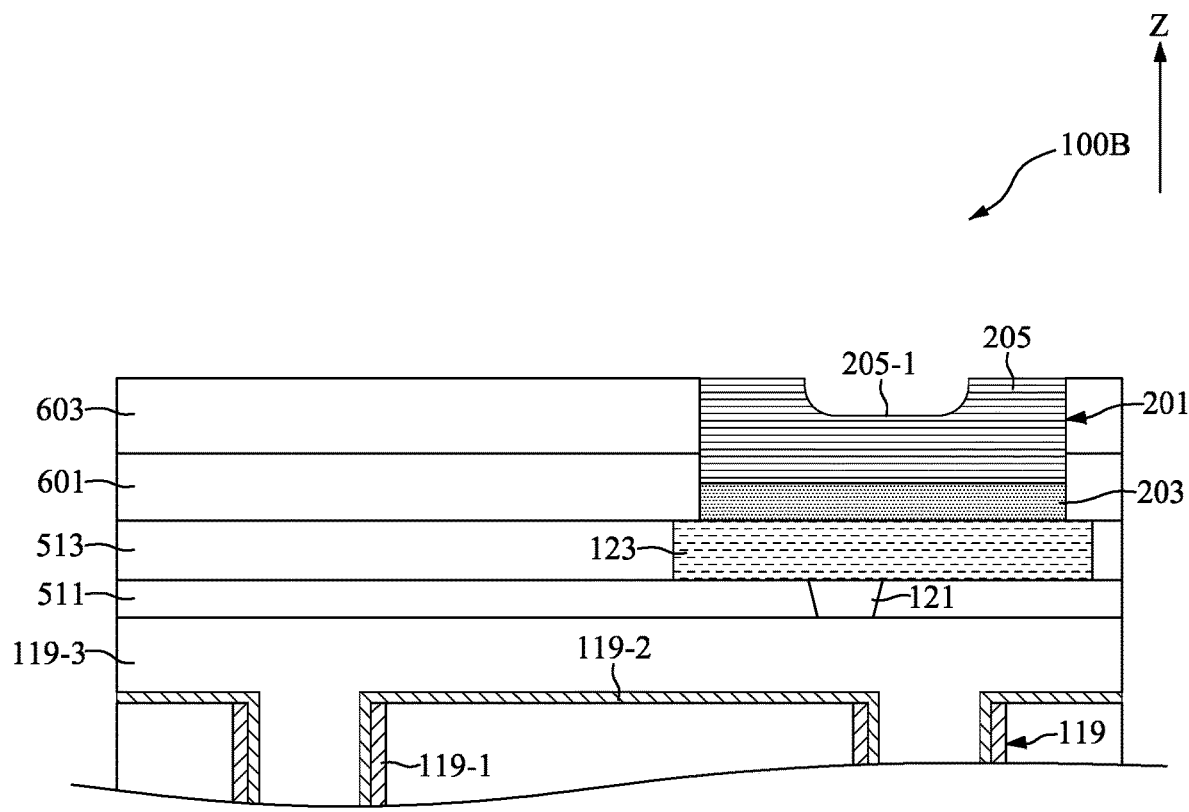
FIG. 4 is a schematic cross-sectional diagram taken along a line A-A' in FIG. 3.

FIG. 3 illustrates, in a schematic top-view diagram, a semiconductor device 100B in accordance with one embodiment of the present disclosure. FIG. 4 illustrates the semiconductor device 100B in accordance with one embodiment of the present disclosure in a schematic cross-sectional diagram taken along a line A-A' in FIG. 3. Some elements of the semiconductor device 100B of the present disclosure are not shown in FIG. 3 for clarity.

With reference to FIGS. 3 and 4, the first top groove 205-1 may be disposed in a center of the top surface of the first top pad 205. The first top groove 205-1 disposed in the center of the top surface of the first top pad 205 may prevent a probe tip from slipping toward the center area or a peripheral area of the semiconductor device 100B.

FIGS. 5 to 8 illustrate, in schematic cross-sectional diagrams, semiconductor devices 100C, 100D, 100E and 100F in accordance with other embodiments of the present disclosure.

Figure 5:
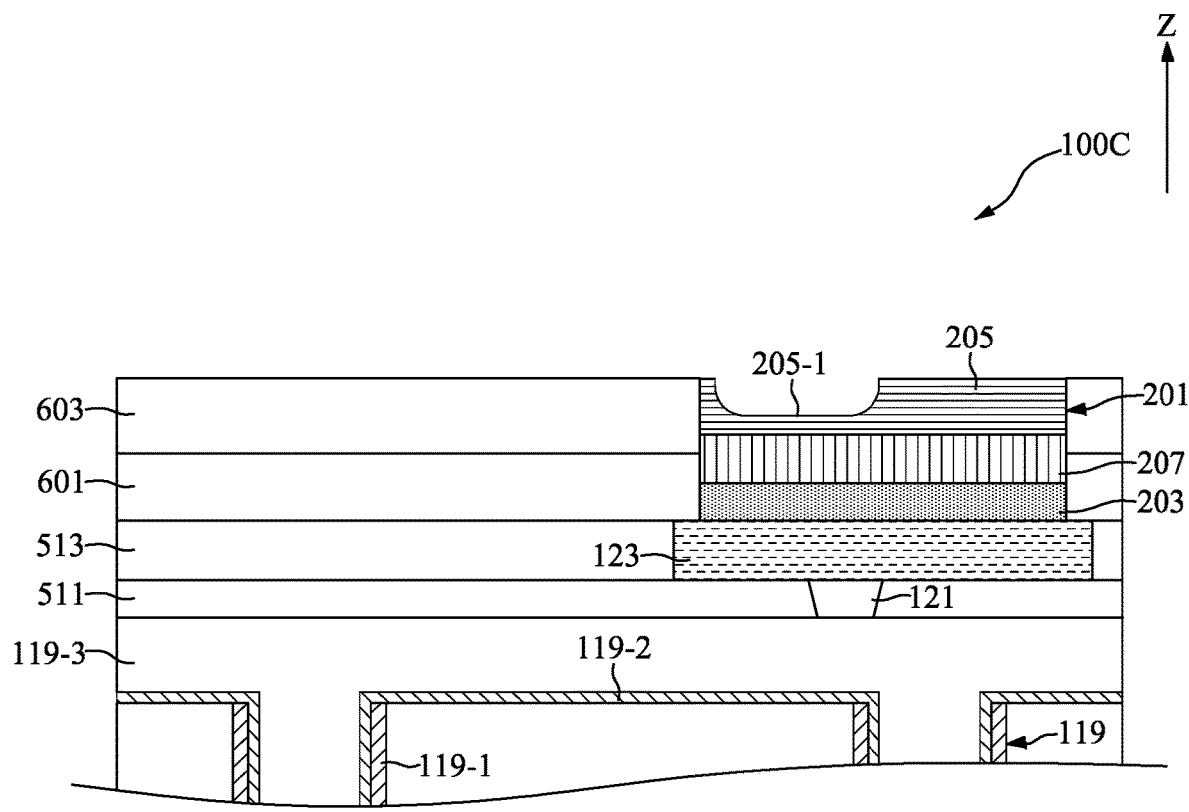
FIGS. 5 to 8 illustrate, in schematic cross-sectional diagrams, semiconductor devices in accordance with other embodiments of the present disclosure.

With reference to FIG. 5, the semiconductor device 100C may include a first middle pad 207. Specifically, the first pad structure 201 may include the first middle pad 207. The first middle pad 207 may be disposed between the first top pad 205 and the first bottom pad 203. The first middle pad 207 may be formed of, for example, nickel. The first bottom pad 203 may be formed of, for example, gold and the first top pad 205 may be formed of, for example, copper.

Figure 6:
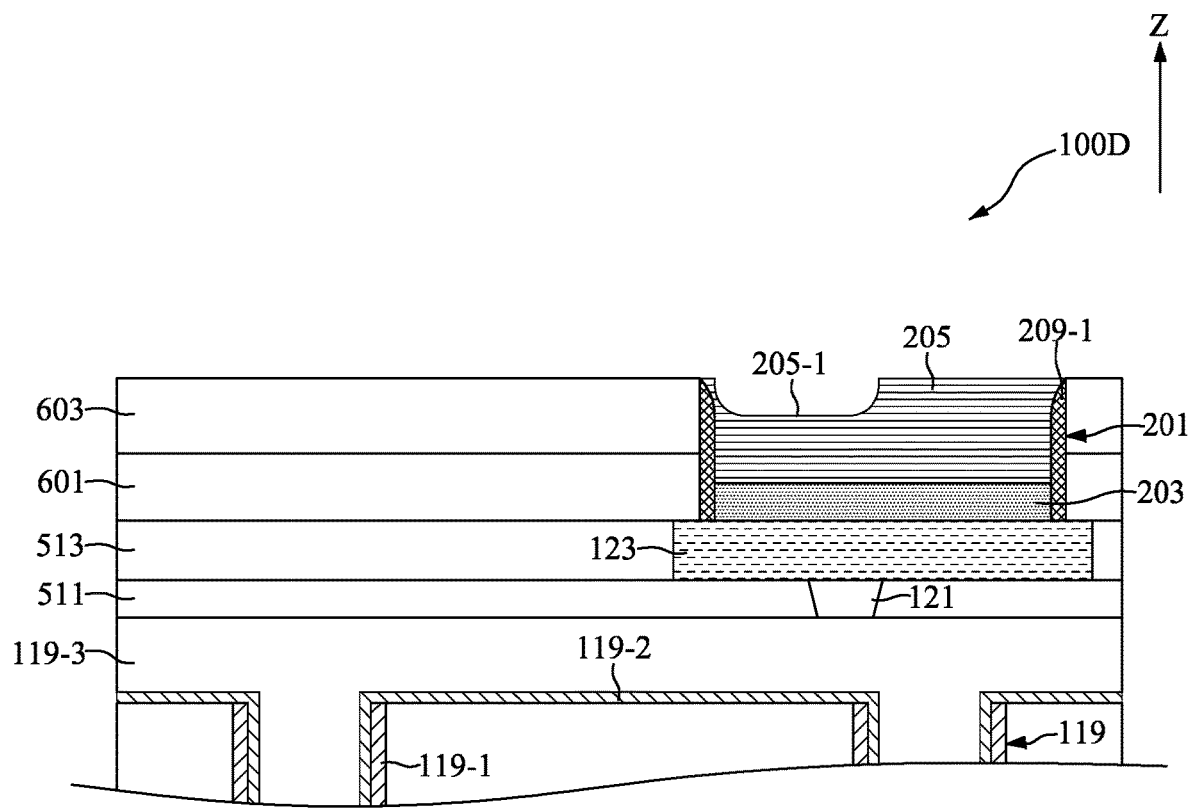

With reference to FIG. 6, the semiconductor device 100D may include two spacers 209-1. Specifically, the first pad structure 201 may include the two spacers 209-1. The two spacers 209-1 may be attached to two sides of the first pad structure 201.

Figure 7:
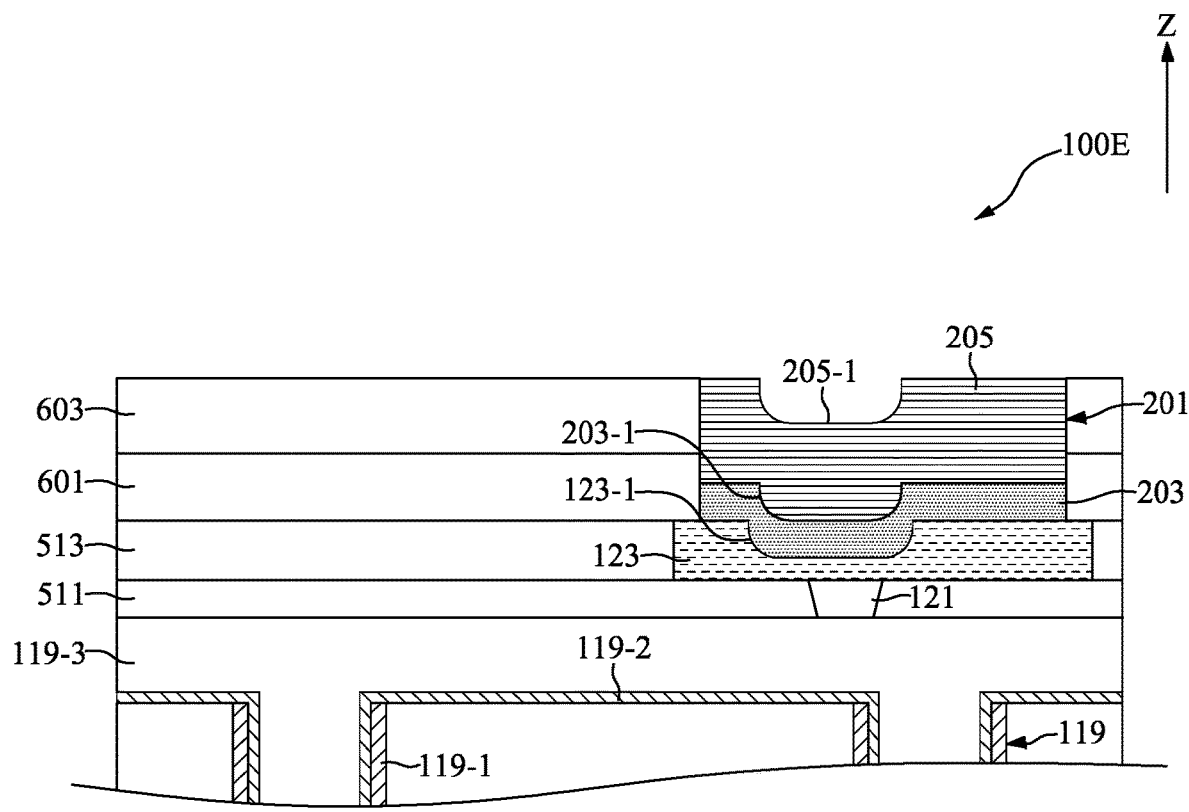

With reference to FIG. 7, the semiconductor device 100E may include a first base groove 123-1 and a first bottom groove 203-1. The first base groove 123-1 may be inwardly disposed on a top surface of the first conductive layer 123. The first bottom pad 203 may be disposed on the first conductive layer 123 and the first base groove 123-1. The first bottom groove 203-1 may be inwardly disposed on a top surface of the first bottom pad 203 and directly above the first base groove 123-1. The first top pad 205 may be disposed on the first bottom pad 203 and the first bottom groove 203-1. The first top groove 205-1 may be directly above the first bottom groove 203-1.

Figure 8:
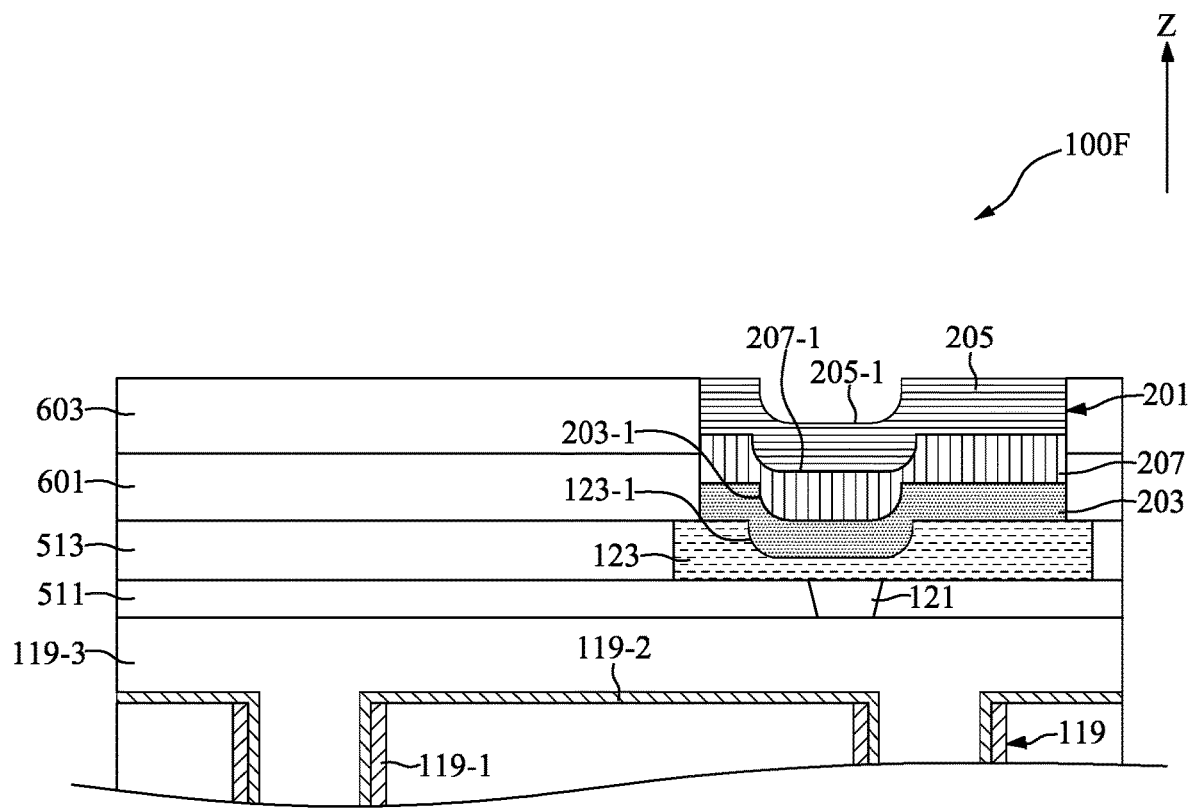

With reference to FIG. 8, the semiconductor device 100F may include a first middle groove 207-1. The first middle pad 207 may be disposed on the first bottom pad 203 and the first bottom groove 203-1. The first middle groove 207-1 may be inwardly disposed on a top surface of the first middle pad 207. The first top pad 205 may be disposed on the first middle pad 207 and the first middle groove 207-1.

Figure 9:
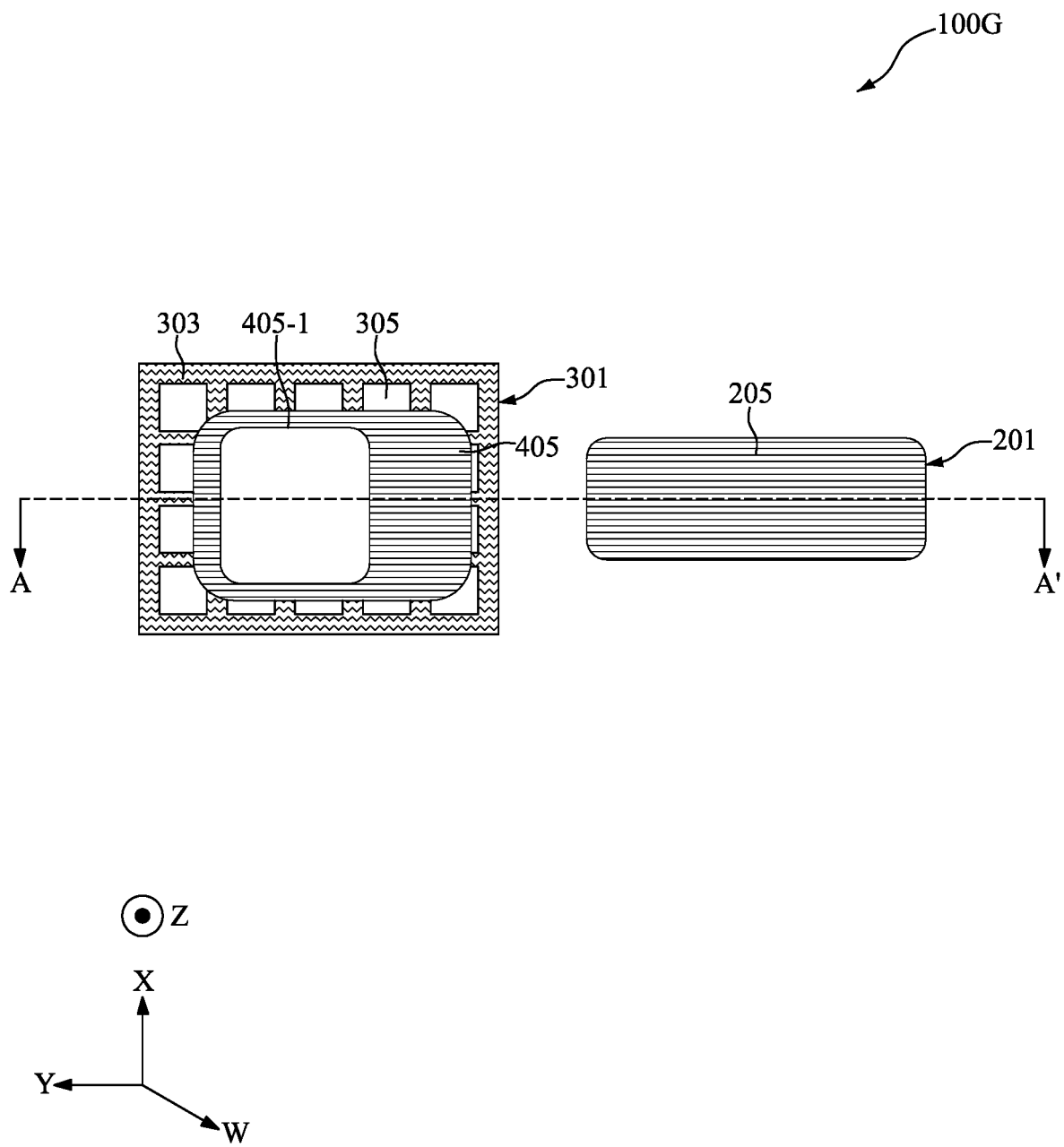
FIG. 9 illustrates, in a schematic top-view diagram, a semiconductor device in accordance with one embodiment of the present disclosure.
Figure 10:
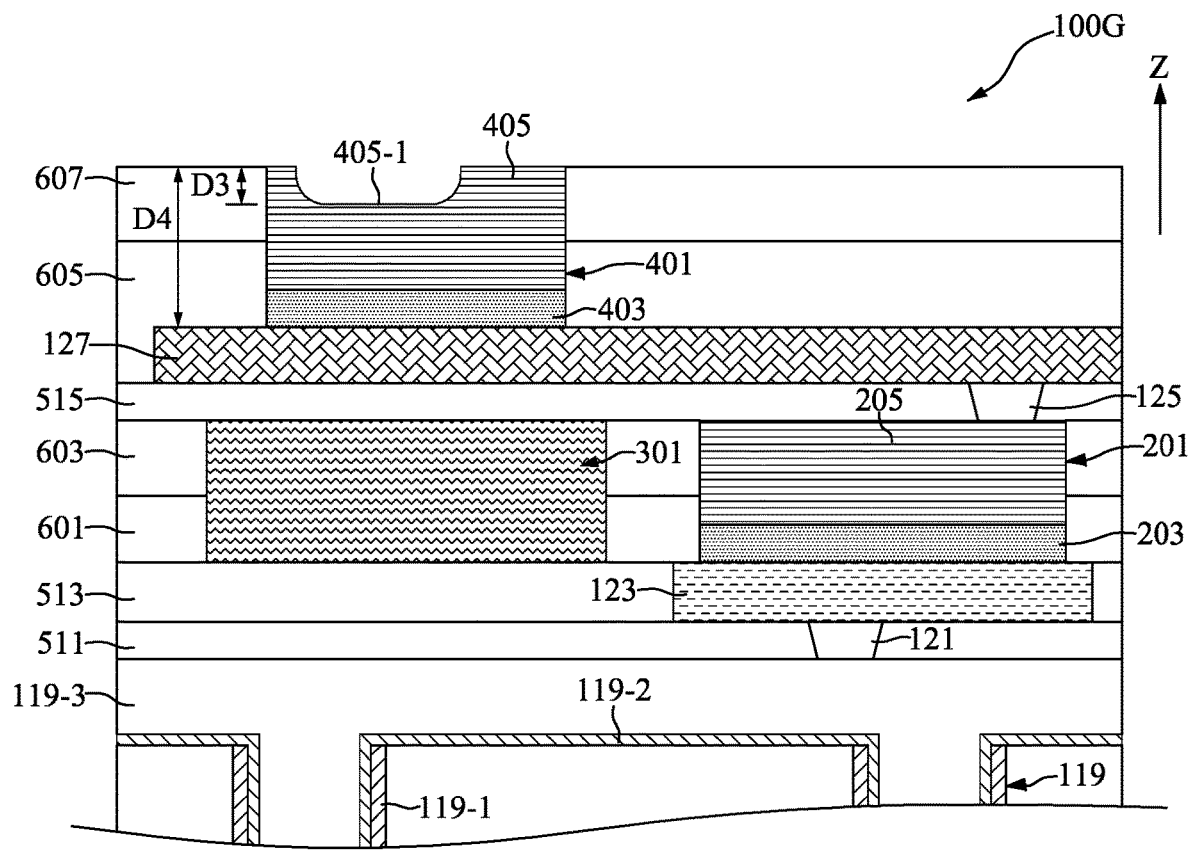
FIG. 10 is a schematic cross-sectional diagram taken along a line A-A' in FIG. 9.

FIG. 9 illustrates, in a schematic top-view diagram, a semiconductor device 100G in accordance with one embodiment of the present disclosure. FIG. 10 illustrates the semiconductor device 100G in accordance with one embodiment of the present disclosure in a schematic cross-sectional diagram taken along a line A-A' in FIG. 9. Some elements of the semiconductor device 100G of the present disclosure are not shown in FIG. 10 for clarity.

With reference to FIGS. 9 and 10, in the embodiment depicted, the semiconductor device may include a second conductive via 125, a redistribution layer 127, a stress relief structure 301, a second pad structure 401, an eighth insulating film 515, a third passivation layer 605, and a fourth passivation layer 607.

With reference to FIGS. 9 and 10, in the embodiment depicted, the stress relief structure 301 may be disposed in the first passivation layer 601 and the second passivation layer 603 and distant from the first pad structure 201. The stress relief structure 301 may include a conductive frame 303 and a plurality of insulating segments 305. The conductive frame 303 may be disposed distant from the first pad structure 201 and may have a mesh shape. That is, members of the conductive frame 303 may be connected to each other. The conductive frame 303 may be formed of, for example, a conductive material such as metal, metal nitride, or metal silicide. The plurality of insulating segments 305 may be disposed within the conductive frame 303 and may have a square shape. The plurality of insulating segments 305 may be formed of a same material as the seventh insulating film 513, but are not limited thereto. Alternatively, in another embodiment, the plurality of insulating segments 305 may be formed of a material including polyimide or an epoxy-based material. The stress relief structure 301 may serve as a cushion to reduce a stress of a wiring process.

With reference to FIGS. 9 and 10, in the embodiment depicted, the eighth insulating film 515 may be disposed on the second passivation layer 603 and formed of a same material as the seventh insulating film 513, but is not limited thereto. The second conductive via 125 may be disposed in the eighth insulating film 515 and on the first top pad 205. The second conductive via 125 may be formed of a same material as the first conductive via 121, but is not limited thereto. The redistribution layer 127 may be disposed on the eighth insulating film 515. The redistribution layer 127 may be disposed above the first pad structure 201 and the stress relief structure 301. The redistribution layer 127 may be formed of, for example, tin, nickel, copper, gold, aluminum, or an alloy thereof. The redistribution layer 127 may be electrically connected to the second conductive via 125.

With reference to FIGS. 9 and 10, in the embodiment depicted, the third passivation layer 605 may be disposed on the eighth insulating film 515 and the redistribution layer 127. The third passivation layer 605 may be formed of a same material as the first passivation layer 601, but is not limited thereto. The fourth passivation layer 607 may be disposed on the third passivation layer 605 and formed of a same material as the second passivation layer 603, but is not limited thereto. The second pad structure 401 may be disposed in the fourth passivation layer 607 and the third passivation layer 605. The second pad structure 401 may be disposed on the redistribution layer 127. The second pad structure 401 may be disposed directly above the stress relief structure 301 and higher than the first pad structure 201. The second pad structure 401 may be electrically connected to the redistribution layer 127 and electrically coupled to the first pad structure 201. The second pad structure 401 may include a second bottom pad 403, a second top pad 405, and a second top groove 405-1.

With reference to FIGS. 9 and 10, in the embodiment depicted, the second bottom pad 403 may be disposed in the third passivation layer 605 and on the redistribution layer 127. The second bottom pad 403 may be formed of a same material as the first bottom pad 203, but is not limited thereto. The second top pad 405 may be disposed in the third passivation layer 605 and the fourth passivation layer 607. The second top pad 405 may be disposed on the second bottom pad 403. A top surface of the second top pad 405 may be even with a top surface of the fourth passivation layer 607. The second top pad 405 may be formed of a same material as the first top pad 205, but is not limited thereto. The second top groove 405-1 may be inwardly disposed on the top surface of the second top pad 405. A ratio of a depth D3 of the second top groove 405-1 and a thickness D4 of the second pad structure 401 may be between 1:10 and 1:20.

Figure 11:
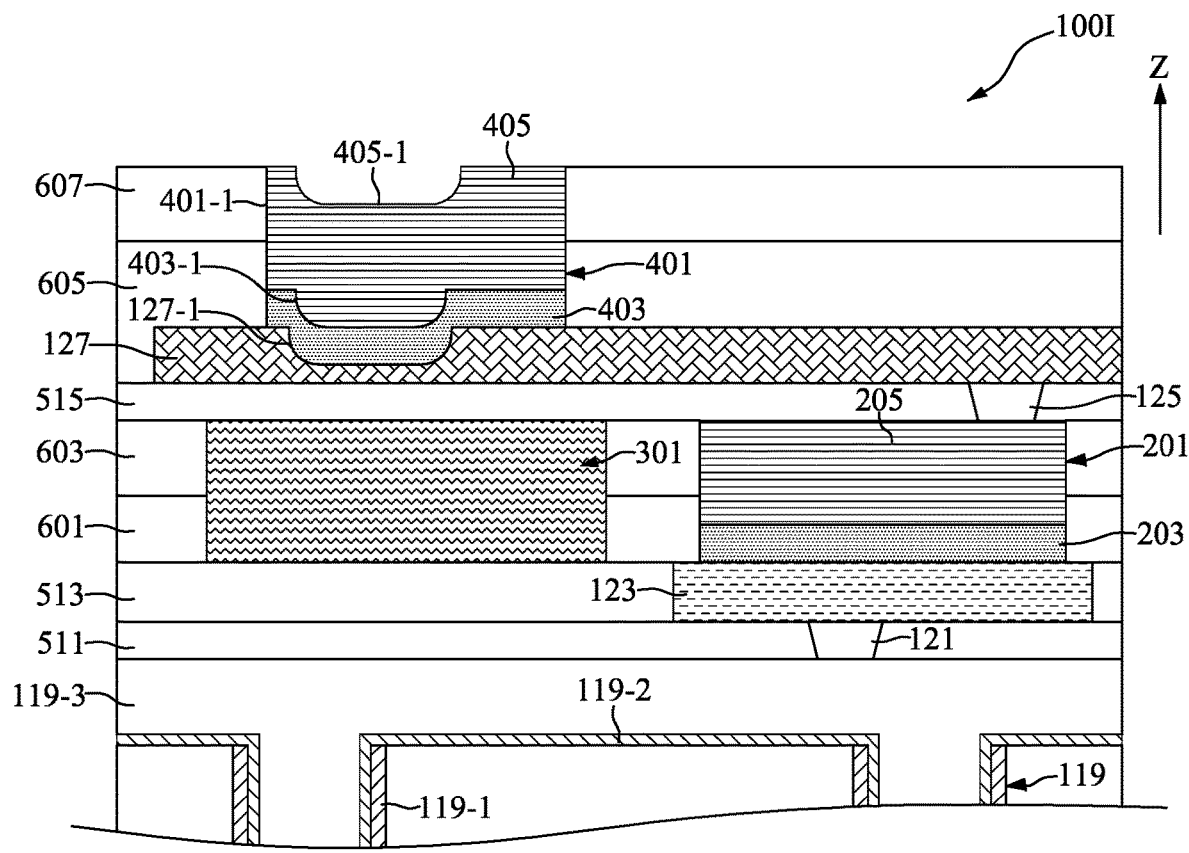
FIG. 11 illustrates, in a schematic cross-sectional diagram, a semiconductor device in accordance with another embodiment of the present disclosure.

FIG. 11 illustrates, in a schematic cross-sectional diagram, a semiconductor device 100I in accordance with another embodiment of the present disclosure.

With reference to FIG. 11, the semiconductor device 100I may include a second base groove 127-1 and a second bottom groove 403-1. The second base groove 127-1 may be inwardly disposed on a top surface of the redistribution layer 127. The second bottom pad 403 may be disposed on the redistribution layer 127 and the second base groove 127-1. The second bottom groove 403-1 may be inwardly disposed on a top surface of the second bottom pad 403 and directly above the second base groove 127-1. The second top pad 405 may be disposed on the second bottom pad 403 and the second bottom groove 403-1. The second top groove 405-1 may be directly above the second bottom groove 403-1.

Figure 12:
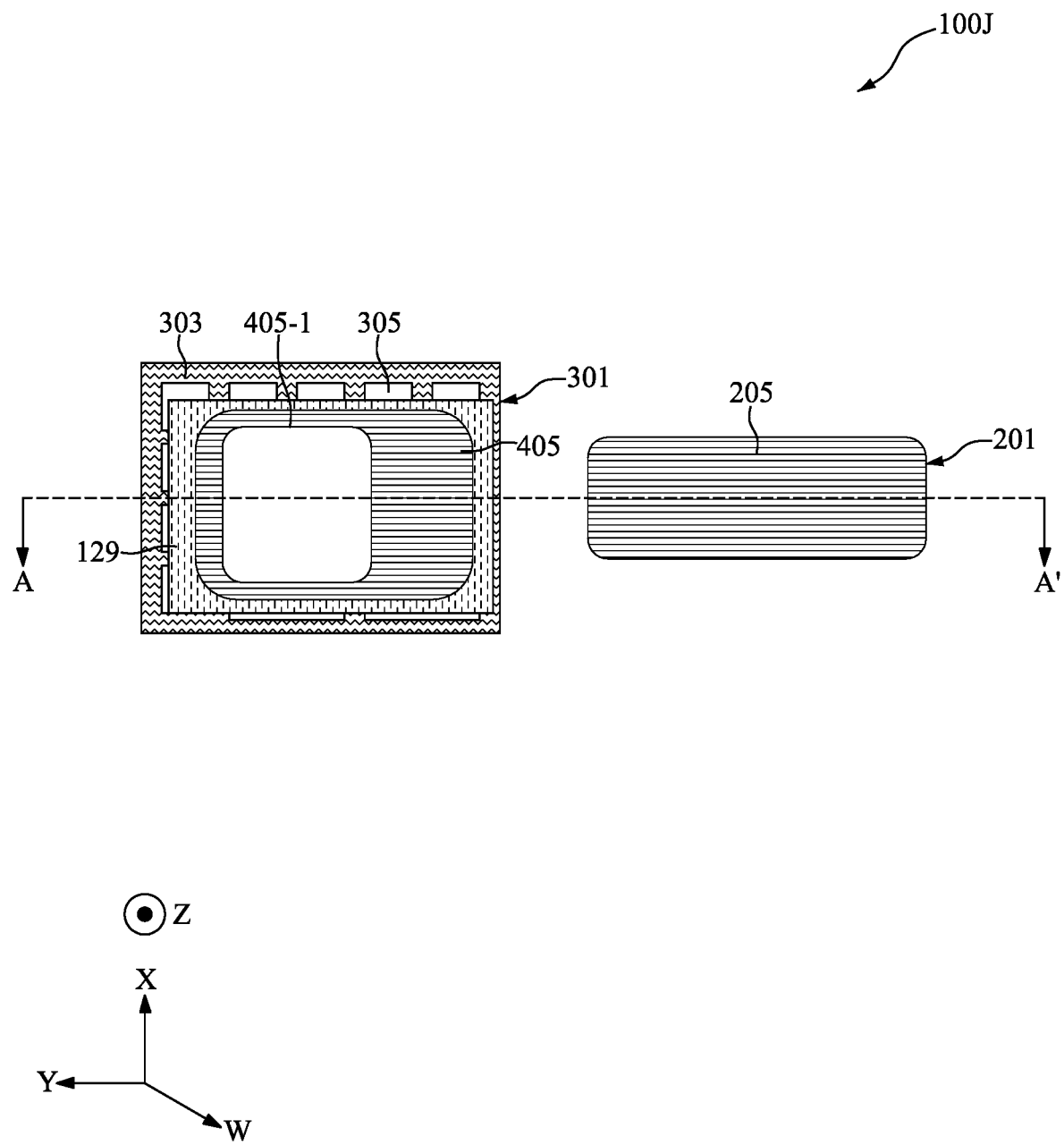
FIG. 12 illustrates, in a schematic top-view diagram, a semiconductor device in accordance with one embodiment of the present disclosure.
Figure 13:
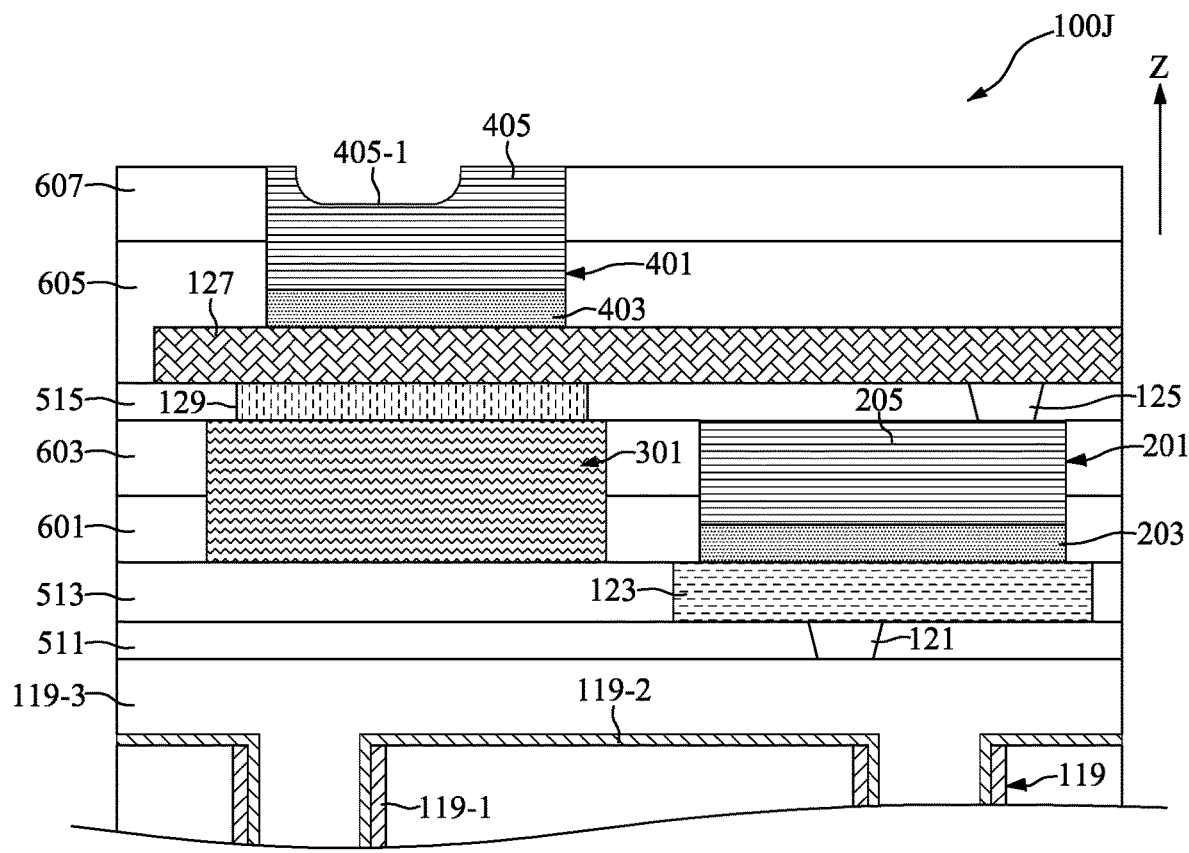
FIG. 13 is a schematic cross-sectional diagram taken along a line A-A' in FIG. 12.

FIG. 12 illustrates, in a schematic top-view diagram, a semiconductor device 100J in accordance with one embodiment of the present disclosure. FIG. 13 illustrates the semiconductor device 100J in accordance with one embodiment of the present disclosure in a schematic cross-sectional diagram taken along a line A-A' in FIG. 12. Some elements of the semiconductor device 100J of the present disclosure are not shown in FIG. 13 for clarity.

With reference to FIG. 12, the semiconductor device 100J may include a stress-buffering layer 129. The stress-buffering layer 129 may be disposed in the eighth insulating film 515 and between the redistribution layer 127 and the stress relief structure 301. The stress-buffering layer 129 may be disposed directly below the second pad structure 401. The stress-buffering layer 129 may be utilized to absorb and redistribute the stress concentrated on the underlying layers created by the shear stresses from thermal expansion mismatches and normal stresses due to a wiring process. The stress-buffering layer 129 may be formed of, for example, a material having a coefficient of thermal expansion of less than about 20 ppm/° C. and a Young's Modulus of less than about 15 GPa. Specifically, the stress-buffering layer 129 may be formed of a material including polyimide or an epoxy-based material. The stress-buffering layer 129 may have a thickness between about 5,000 angstroms and about 100,000 angstroms. Preferably, the thickness of the stress-buffering layer 129 may be between about 10,000 angstroms and about 50,000 angstroms.

Figure 14:
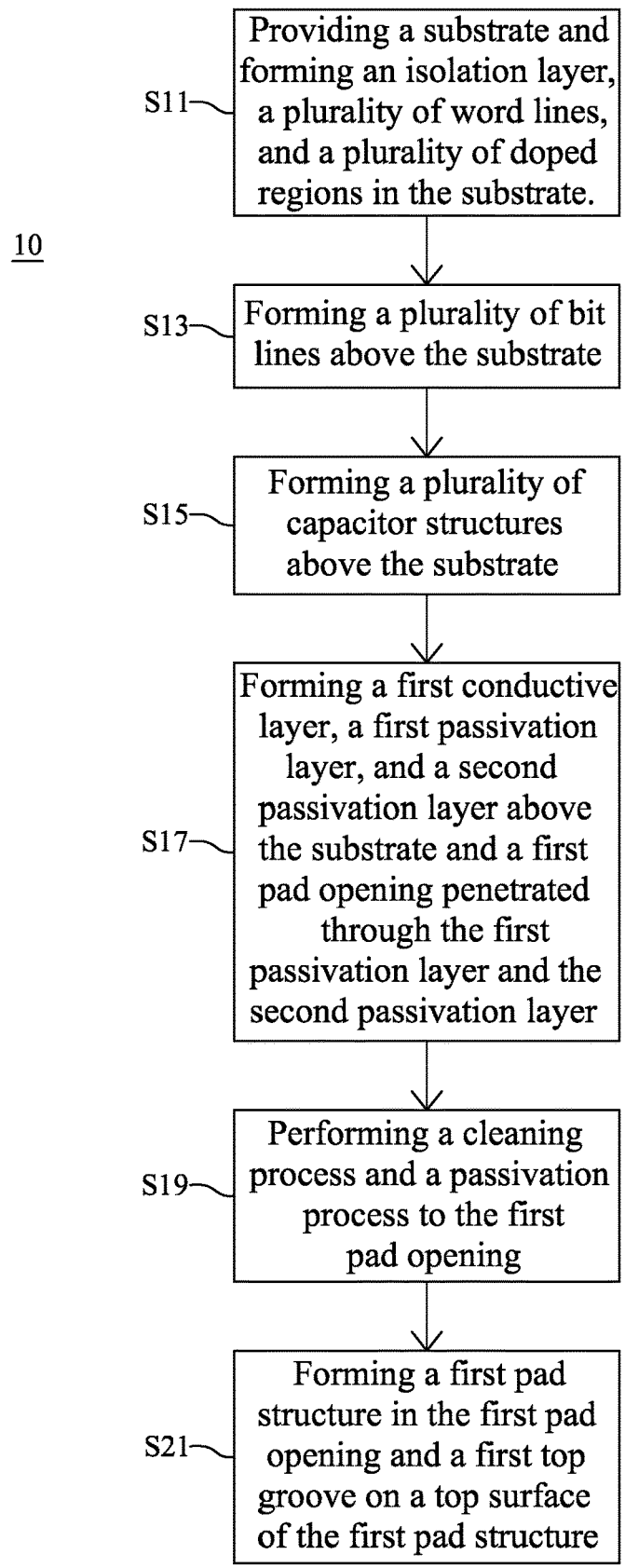
FIG. 14 illustrates, in a flowchart diagram form, a method for fabricating a semiconductor device in accordance with one embodiment of the present disclosure.
Figure 15:
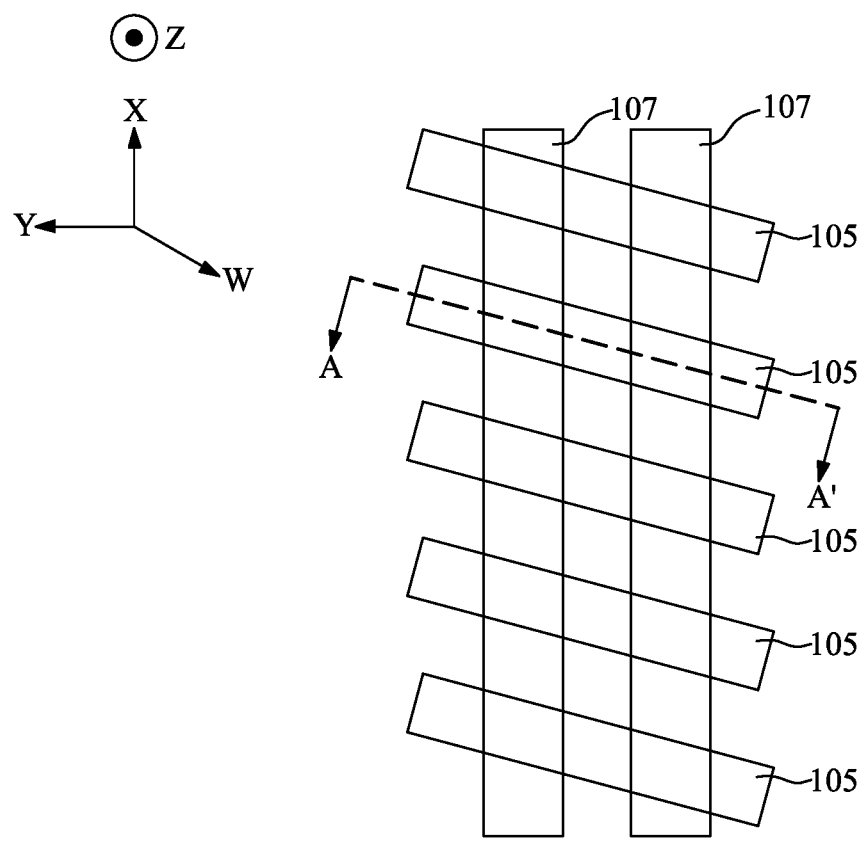
FIG. 15 illustrates, in a schematic top-view diagram, the semiconductor device in accordance with one embodiment of the present disclosure.
Figure 16:
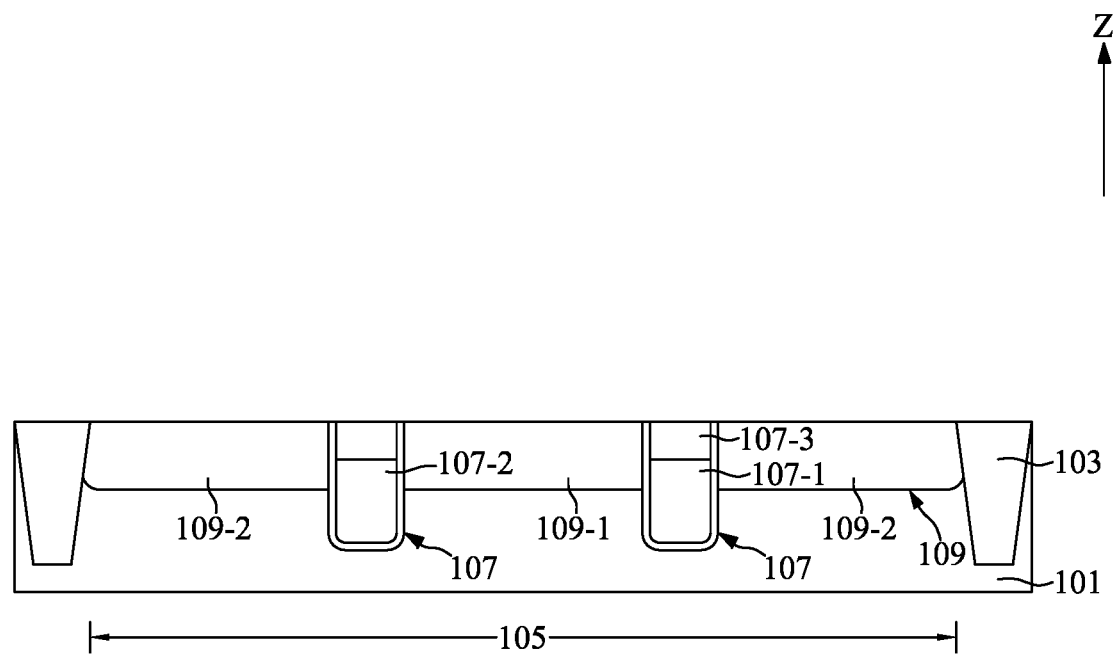
FIG. 16 is a schematic cross-sectional diagram taken along a line A-A' in FIG. 15.

FIG. 14 illustrates, in a flowchart diagram form, a method 10 for fabricating a semiconductor device 100A in accordance with one embodiment of the present disclosure. FIG. 15 illustrates, in a schematic top-view diagram, the semiconductor device 100A in accordance with one embodiment of the present disclosure. FIG. 16 illustrates part of a flow of fabricating the semiconductor device 100A in accordance with one embodiment of the present disclosure in a schematic cross-sectional diagram taken along a line A-A' in FIG. 15. Some elements of the semiconductor device of the present disclosure are not shown in FIG. 16 for clarity.

With reference to FIGS. 14 to 16, at step S11, in the embodiment depicted, a substrate 101 may be provided, and an isolation layer 103, a plurality of word lines 107, and a plurality of doped regions 109 may be formed in the substrate 101. The isolation layer 103 may define a plurality of active areas 105. The plurality of active areas 105 may be separated from each other and may extend along a direction W in a top-view diagram. The plurality of word lines 107 may extend along a direction X diagonal with respect to the direction W. Each of the plurality of active regions 105 may intersect two of the plurality of word lines 107. The plurality of word lines 107 may include a plurality of word line insulating layers 107-1, a plurality of word line electrodes 107-2, and a plurality of word line capping layers 107-3. The plurality of word line insulating layers 107-1 may be inwardly formed in the substrate 101. The plurality of word line electrodes 107-2 may be respectively correspondingly formed on the plurality of word line insulating layers 107-1. The plurality of word line capping layers 107-3 may be formed on the plurality of word line electrodes 107-2. A planarization process, such as chemical mechanical polishing, may be performed to provide a substantially flat surface for subsequent processing steps.

With reference to FIG. 16, the plurality of doped regions 109 may include a first doped region 109-1 and two second doped regions 109-2. The first doped region 109-1 may be formed between the plurality of word lines 107. Each of the two second doped regions 109-2 may be formed between the isolation layer 103 and one of the plurality of word lines 107.

Figure 17:
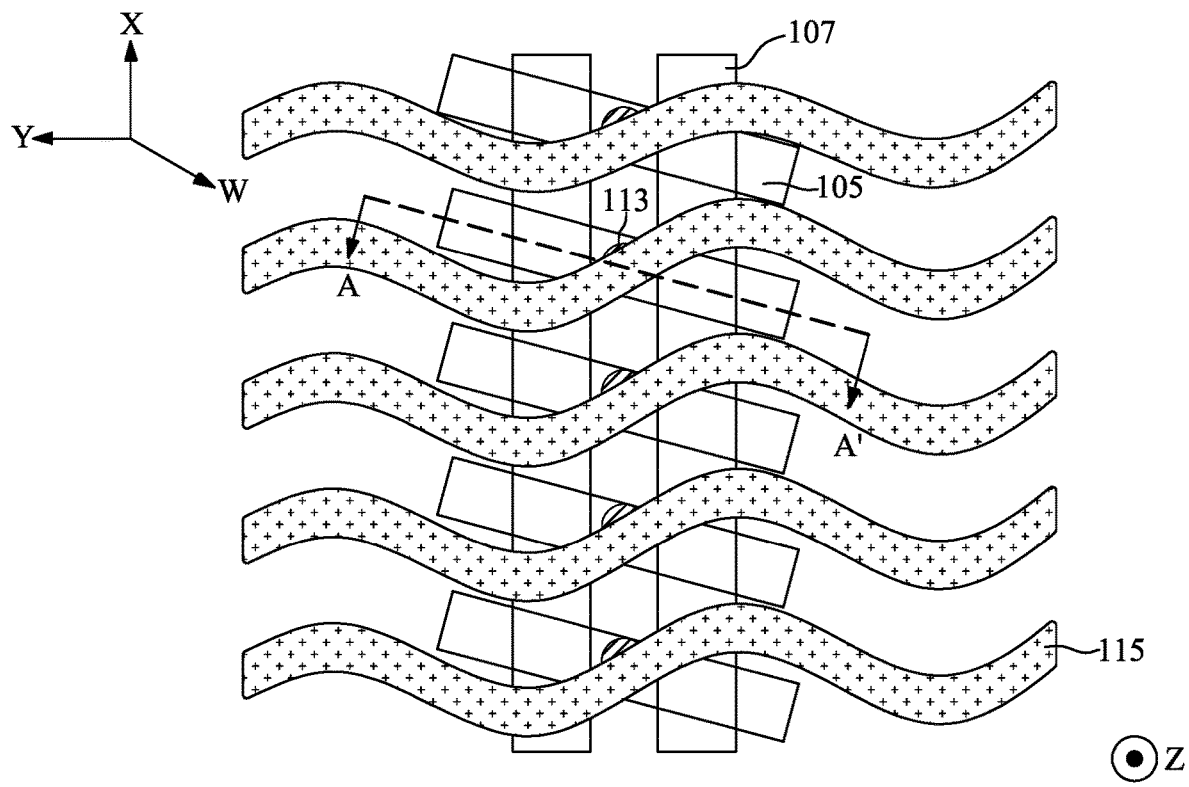
FIG. 17 illustrates, in a schematic top-view diagram, the semiconductor device in accordance with one embodiment of the present disclosure.
Figure 18:
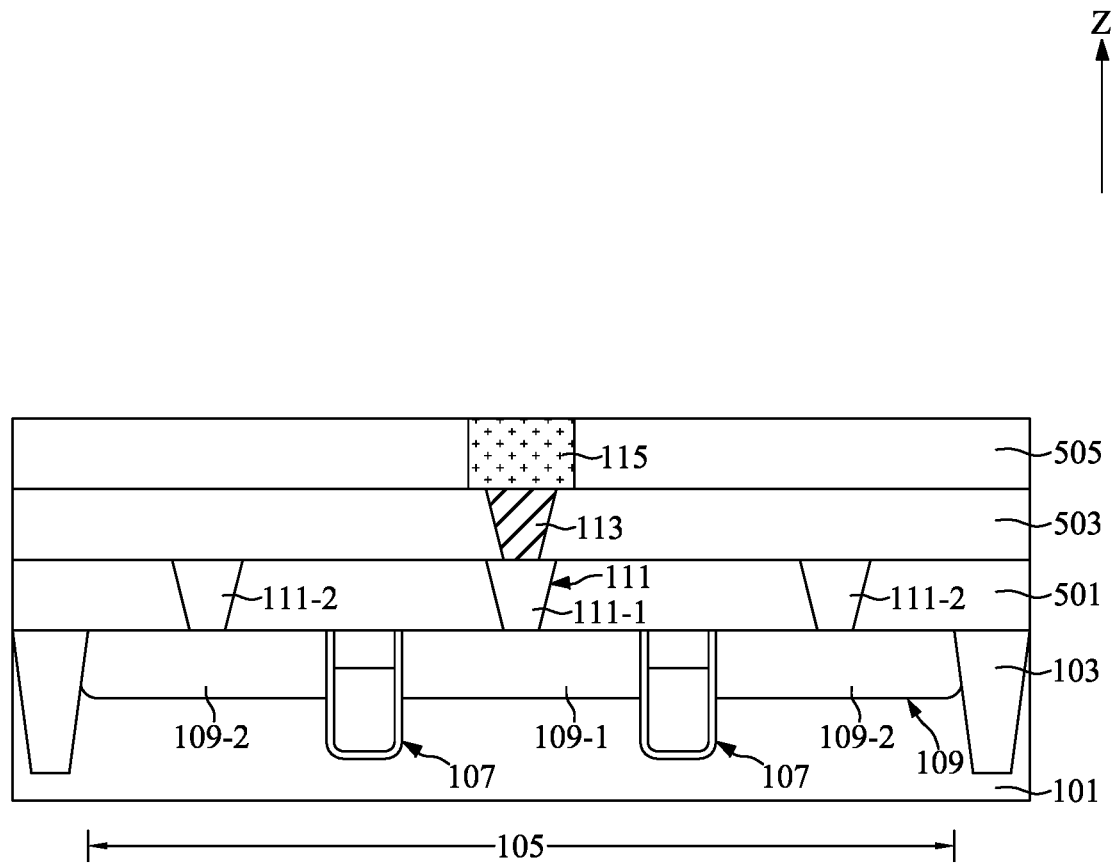
FIG. 18 is a schematic cross-sectional diagram taken along a line A-A' in FIG. 17.

FIG. 17 illustrates, in a schematic top-view diagram, the semiconductor device 100A in accordance with one embodiment of the present disclosure. FIG. 18 illustrates part of a flow of fabricating the semiconductor device 100A in accordance with one embodiment of the present disclosure in a schematic cross-sectional diagram taken along a line A-A' in FIG. 17. Some elements of the semiconductor device of the present disclosure are not shown in FIG. 18 for clarity. FIGS. 19 to 24 illustrate, in schematic cross-sectional diagrams, part of the flow of fabricating the semiconductor device 100A in accordance with one embodiment of the present disclosure.

With reference to FIGS. 14, 17, and 18, at step S13, in the embodiment depicted, a plurality of bit lines 115 may be formed above the substrate 101. A first insulating film 501, a second insulating film 503, and a third insulating film 505 may be sequentially formed on the substrate 101. For each of the plurality of active regions 105, a first contact 111-1 and two second contacts 111-2 may be formed in the first insulating film 501. The first contact 111-1 may be formed on the first doped region 109-1. The two second contacts 111-2 may be respectively correspondingly formed on the two second doped regions 109-2. A plurality of bit line contacts 113 may be formed in the second insulating film 503. The plurality of bit line contacts 113 may be respectively correspondingly disposed on the plurality of first contacts 111-1. A plurality of bit lines 115 may be formed in the third insulating film 505. The plurality of bit lines 115 may extend along a direction Y diagonal with respect to the direction W and perpendicular to the direction X. The plurality of bit lines 115 may be implemented as wavy lines. The plurality of bit lines 115 may be separated from each other. Each of the plurality of bit lines 115 may intersect one of the plurality of active regions 105 in a top view diagram. The plurality of bit lines 115 may be electrically connected to the plurality of bit line contacts 113.

Figure 19:
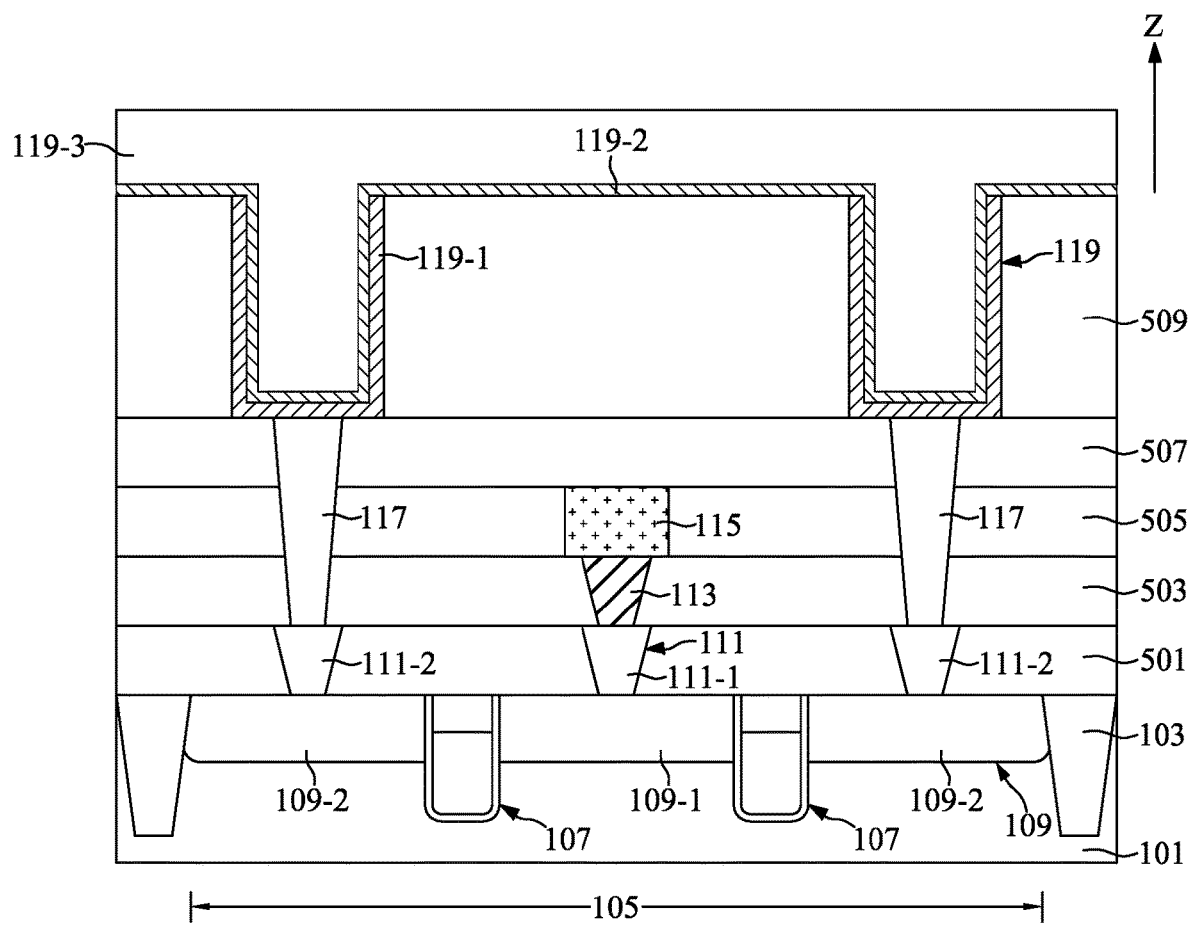
FIGS. 19 to 24 illustrate, in schematic cross-sectional diagrams, part of the flow of fabricating the semiconductor device in accordance with one embodiment of the present disclosure.

With reference to FIGS. 14 and 19, at step S15, in the embodiment depicted, a plurality of capacitor structures 119 may be formed above the substrate 101. A fourth insulating film 507 may be formed on the third insulating film 505. A plurality of plugs 117 may be formed so as to penetrate through the fourth insulating film 507, the third insulating film 505, and the second insulating film 503. For each of the plurality of active regions 105, the plurality of plugs 117 may be respectively correspondingly disposed on the two second contacts 111-2.

With reference to FIG. 19, a fifth insulating film 509 may be formed on the fourth insulating film 507. The plurality of capacitor structures 119 may include a plurality of capacitor bottom electrodes 119-1, a capacitor insulating layer 119-2, and a capacitor top electrode 119-3. The plurality of capacitor bottom electrodes 119-1 may be inwardly formed in the fifth insulating film 509. The capacitor insulating layer 119-2 may be formed on the plurality of capacitor bottom electrodes 119-1. The capacitor top electrode 119-3 may be formed on the capacitor insulating layer 119-2. A planarization process, such as chemical mechanical polishing, may be performed to provide a substantially flat surface for subsequent processing steps.

Figure 20:
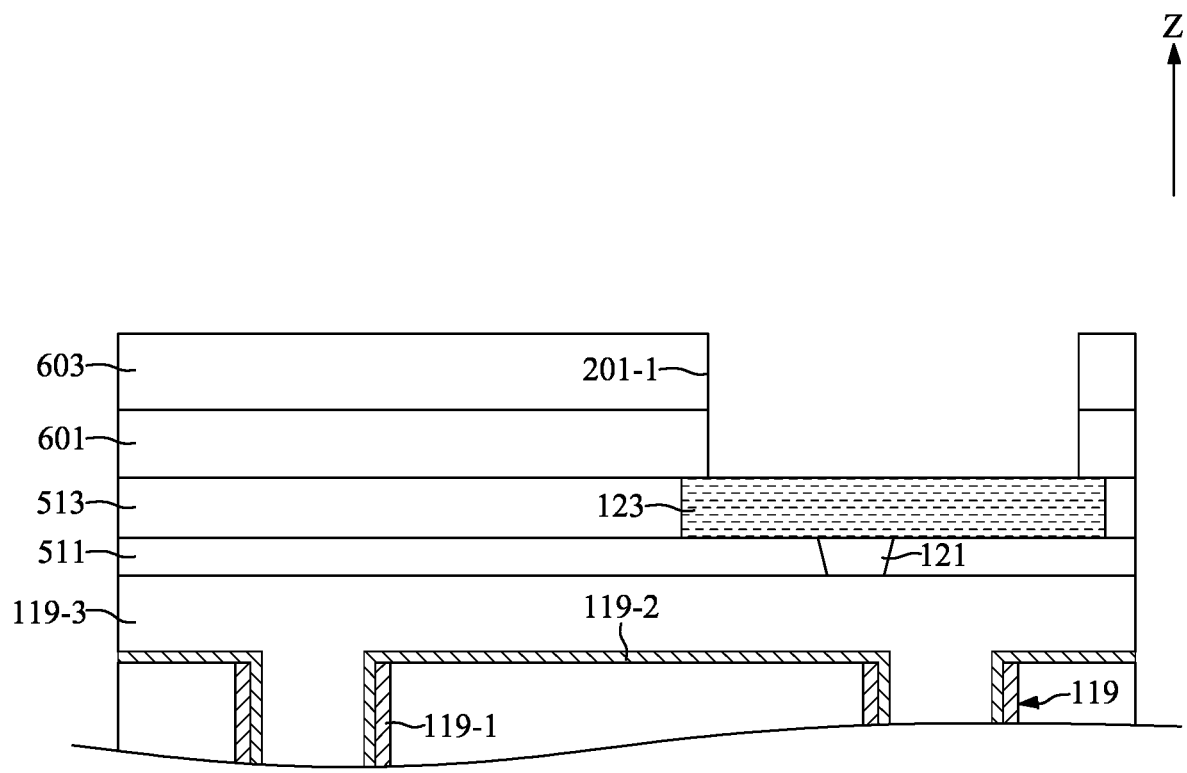

With reference to FIGS. 14 and 20, at step S17, in the embodiment depicted, a first conductive layer 123, a first passivation layer 601, and a second passivation layer 603 may be formed above the substrate 101, and a first pad opening 201-1 may be formed so as to penetrate through the first passivation layer 601 and the second passivation layer 603. A sixth insulating film 511 and a seventh insulating film 513 may be sequentially formed on the capacitor top electrode 119-3. A first conductive via 121 may be formed in the sixth insulating film 511 and on the capacitor top electrode 119-3. The first conductive layer 123 may be formed in the seventh insulating film 513 and on the first conductive via 121. The first passivation layer 601 and the second passivation layer 603 may be sequentially formed on the seventh insulating film 513. A photolithography process may be performed to define a position of the first pad opening 201-1. After the photolithography process, an etch process, such as an anisotropic dry etch process, may be performed to form the first pad opening 201-1. A portion of the top surface of the first conductive layer 123 may be exposed through the first pad opening 201-1.

Figure 21:
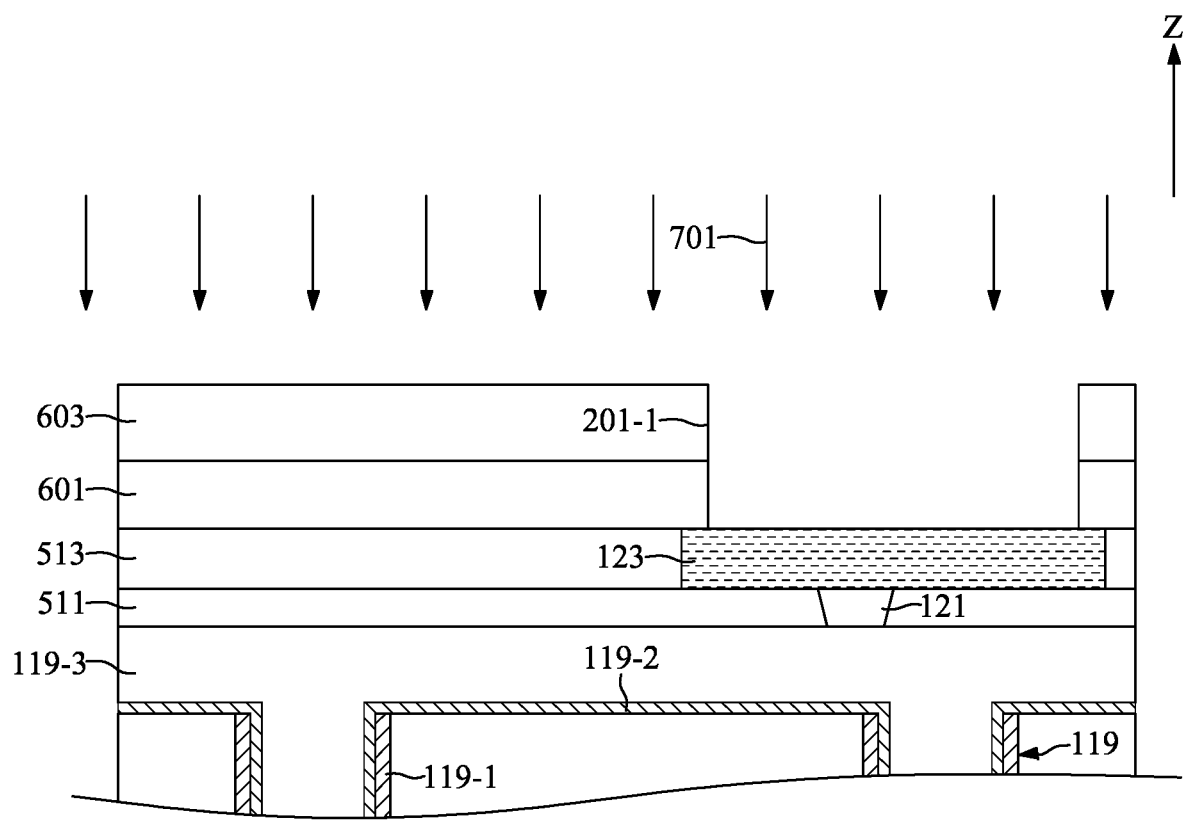
Figure 22:
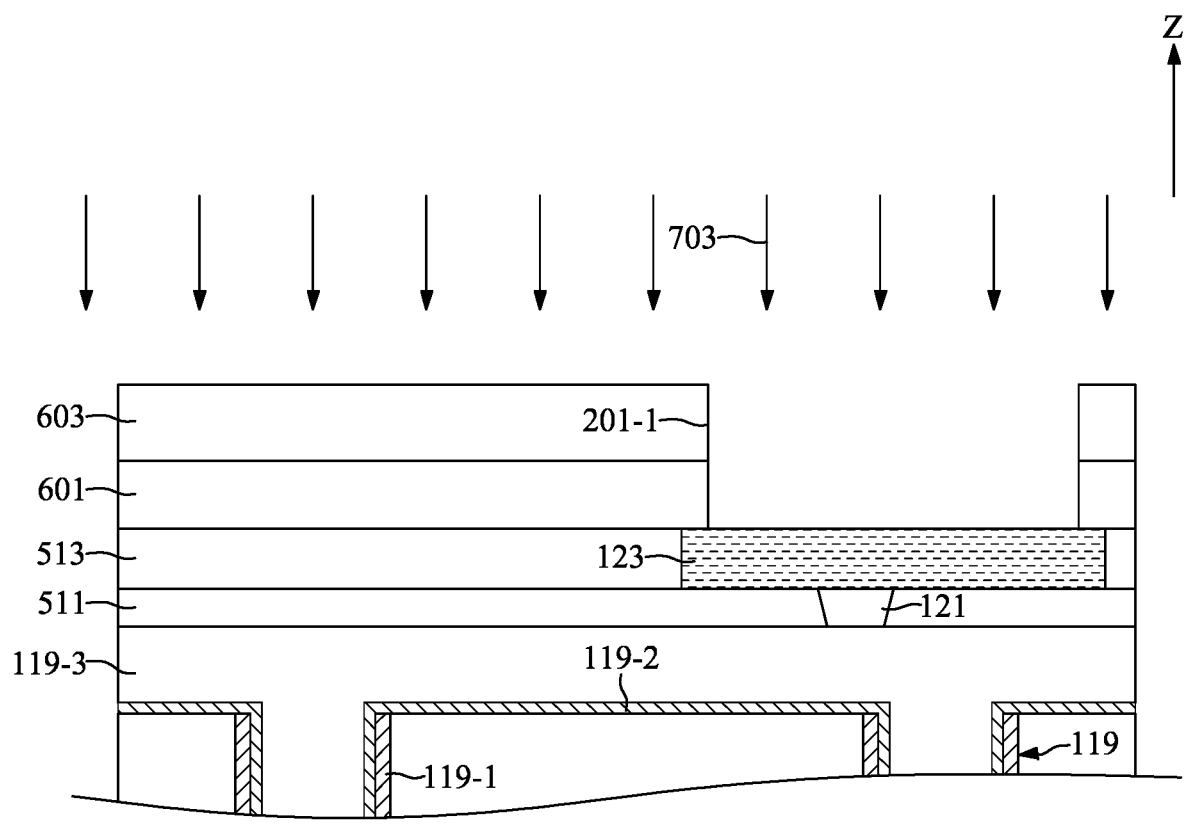

With reference to FIGS. 14, 21, and 22, at step S19, in the embodiment depicted, a cleaning process 701 and a passivation process 703 may be performed on the first pad opening 201-1. With reference to FIG. 21, the cleaning process 701 may be performed after the aforementioned etch process. The cleaning process 701 may include applying a mixture of hydrogen and argon as a remote plasma source with a process temperature between about 250° C. and about 350° C. and a process pressure ranging between about 1 Torr and about 10 Torr in the presence of a bias energy applied to the equipment performing the cleaning process 701. The bias energy may be between about 0 W and 200 W. The cleaning process 701 may remove oxide, originating from oxidation by oxygen in the air, from the top surface of the first conductive layer 123 without damaging the conductive feature of the first conductive layer 123.

With reference to FIG. 22, the passivation process 703 may be performed over the second passivation layer 603 and the first pad opening 201-1. The passivation process 703 may include soaking the semiconductor device with a precursor such as dimethylaminotrimethylsilane, tetramethylsilane, or the like at a process temperature between about 200° and about 400° C. An ultraviolet energy may be used to facilitate the passivation process 703. The passivation process 703 may passivate sidewalls of the second passivation layer 603 and the first passivation layer 601 exposed through the first pad opening 201-1 by sealing surface pores thereof to reduce undesirable sidewall growth, which may affect the electric characteristics of the semiconductor device 100A, during subsequent processing steps. As a result, the performance and reliability of the semiconductor device 100A may be increased.

Figure 23:
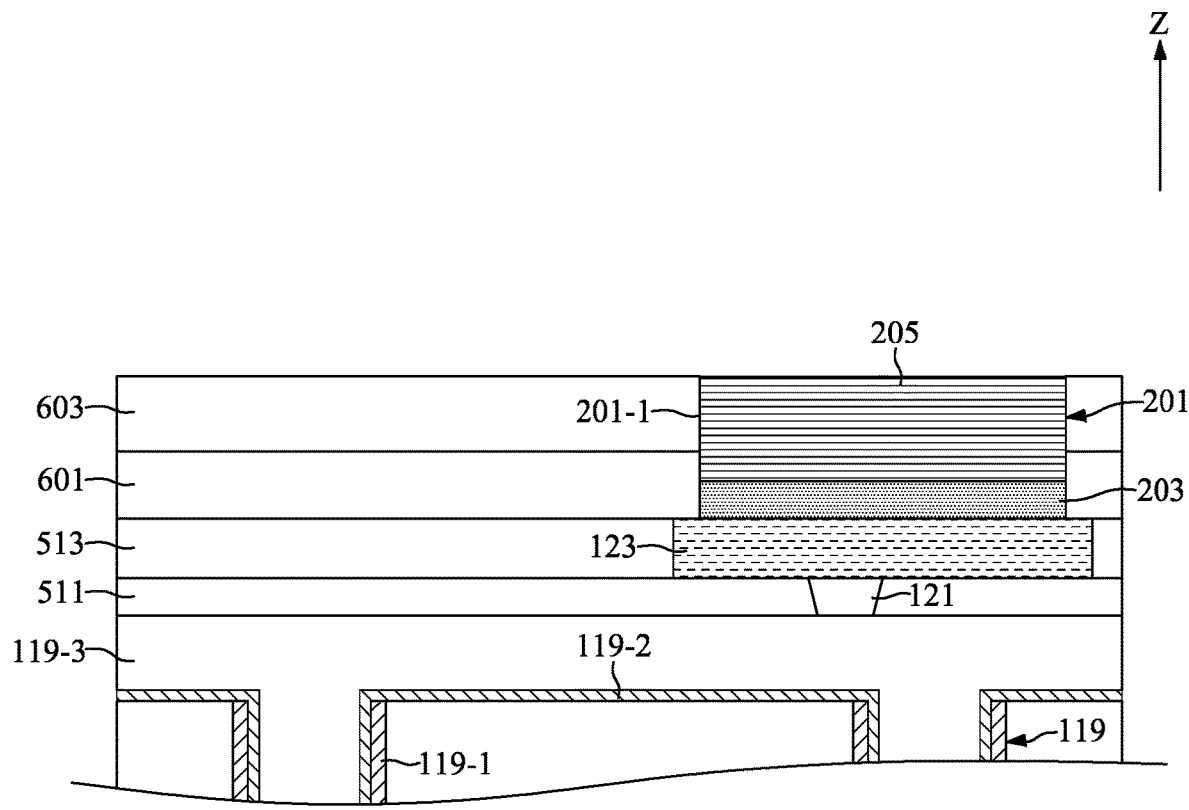
Figure 24:
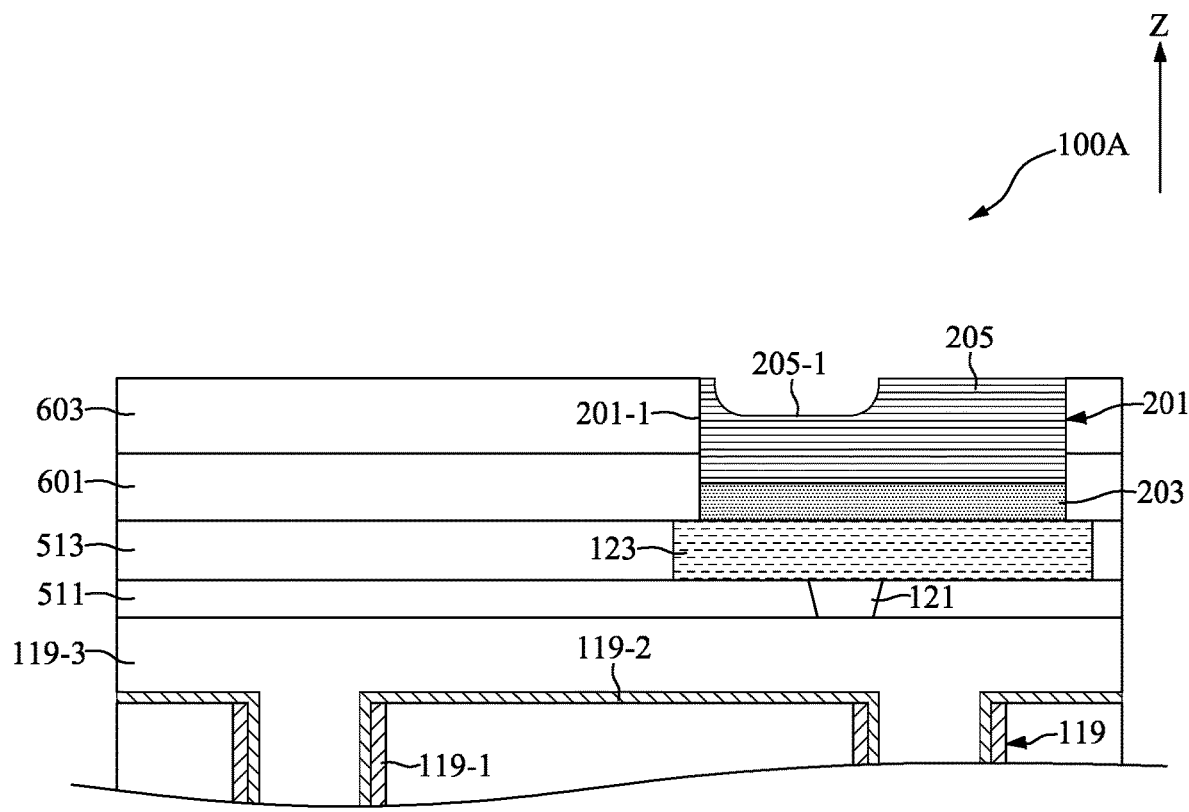

With reference to FIGS. 14, 23, and 24, at step S21, in the embodiment depicted, a first pad structure 201 may be formed in the first pad opening 201-1 and a first top groove 205-1 may be formed on a top surface of the first pad structure 201. The first pad structure 201 may include a first bottom pad 203, a first top pad 205, and the first top groove 205-1. With reference to FIG. 23, the first bottom pad 203 may be formed on the first conductive layer 123 in the first pad opening 201-1 by electroplating or electroless plating. The first bottom pad 203 may include nickel and may serve as a barrier between the first conductive layer 123 formed of copper and the first top pad 205. The first top pad 205 may be formed on the first bottom pad 203 in the first pad opening 201-1 by electroplating or electroless plating. The first top pad 205 may include palladium, cobalt, or a combination thereof. A photolithography process may be performed to define a position of the first top groove 205-1. After the photolithography process, an etch process may be performed to form the first top groove 205-1 on the top surface of the first top pad 205.

Figure 25:
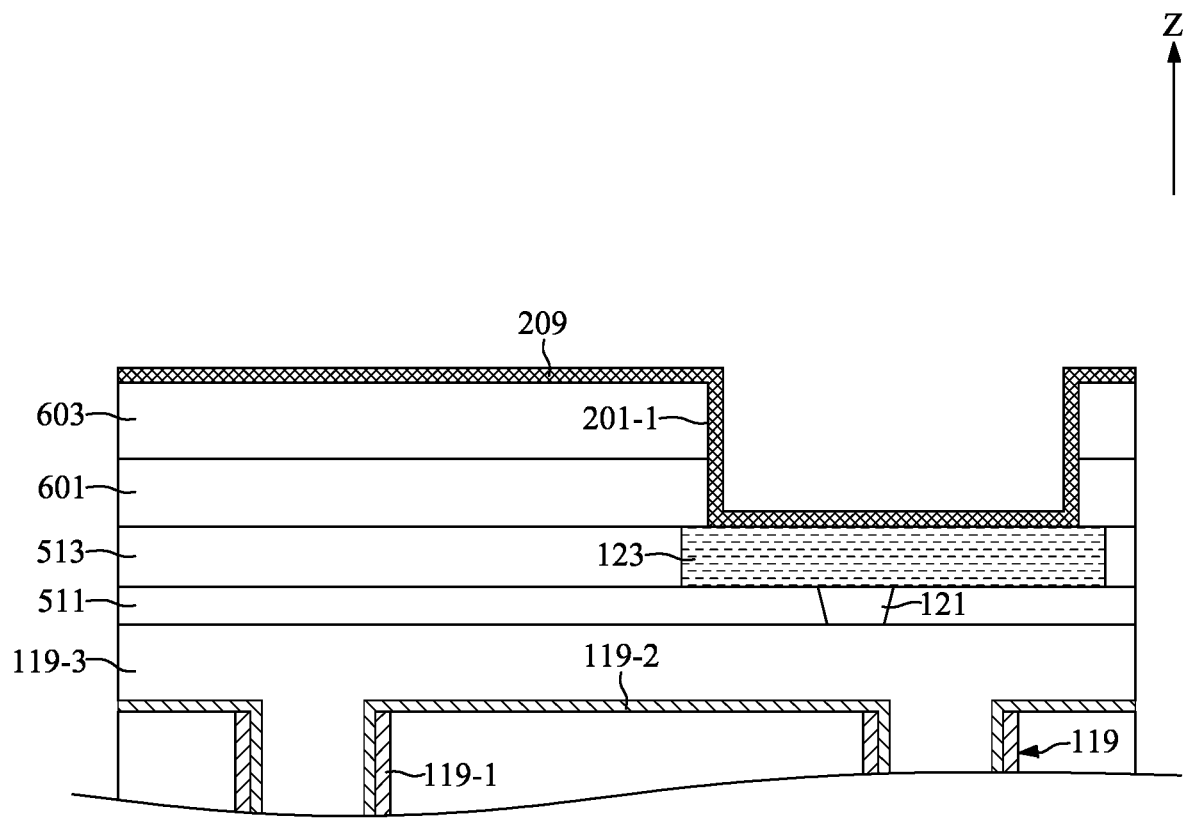
FIGS. 25 and 26 illustrate, in schematic cross-sectional diagrams, part of a flow of fabricating a semiconductor device in accordance with another embodiment of the present disclosure.
Figure 26:
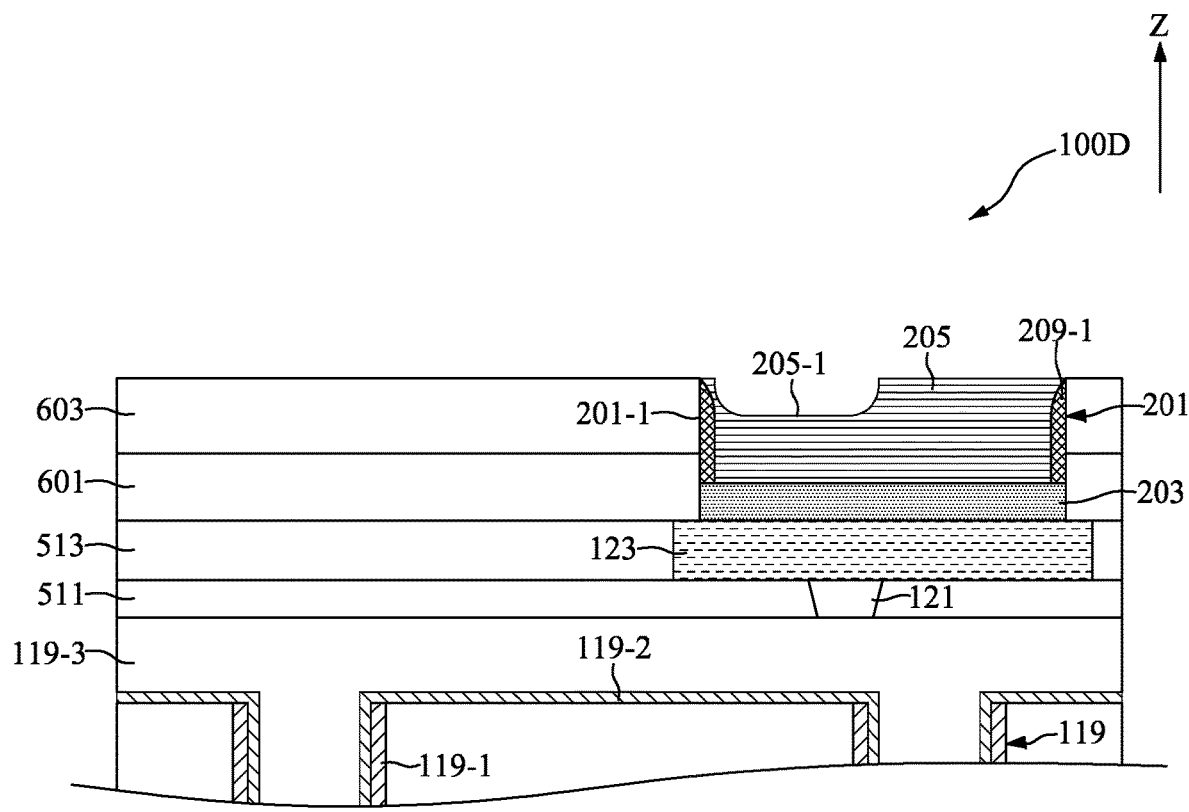

FIGS. 25 and 26 illustrate, in schematic cross-sectional diagrams, part of a flow of fabricating a semiconductor device 100D in accordance with another embodiment of the present disclosure.

With reference to FIG. 25, an intermediate semiconductor device may be fabricated by a procedure similar to that illustrated in FIGS. 15 to 20. A spacer layer 209 may be formed on a top surface of the second passivation layer 603 and in the first pad opening 201-1 by a deposition process such as chemical vapor deposition, physical vapor deposition, or the like. After the deposition process, an etch process, such as an anisotropic dry etch process, may be performed to remove a portion of the spacer layer 209 formed on the top surface of the second passivation layer 603 and a bottom of the first pad opening 201-1 and concurrently form two spacers 209-1. The two spacers 209-1 may be formed so as to be attached to sidewalls of the first pad opening 201-1. With reference to FIG. 26, the first bottom pad 203 may be formed on the first conductive layer 123 and between the two spacers 209-1. The first top pad 205 may be formed on the first bottom pad 203 and between the two spacers 209-1. The first top groove 205-1 may be formed on the top surface of the first top pad 205 and adjacent to one of the two spacers 209-1. Alternatively, in another embodiment, the first top groove 205-1 may be formed distant from the two spacers 209-1.

Figure 27:
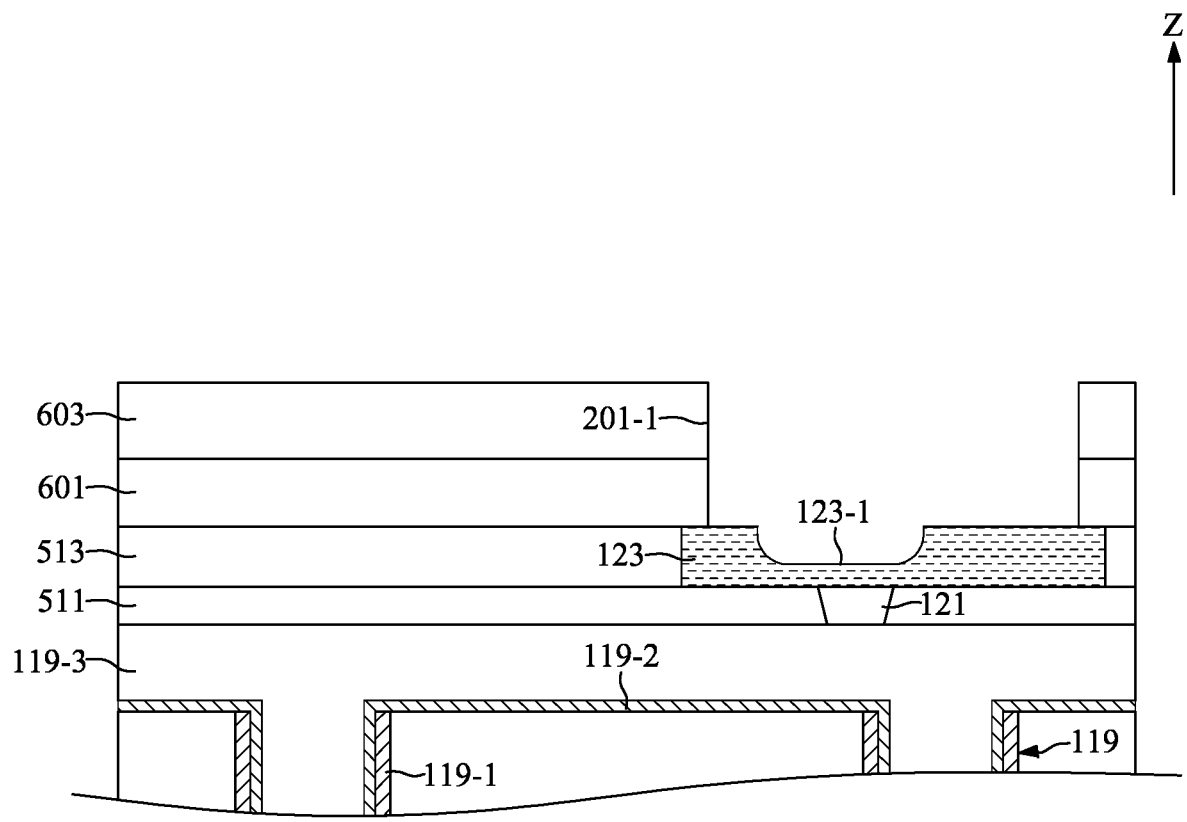
FIGS. 27 to 29 illustrate, in schematic cross-sectional diagrams, part of a flow of fabricating a semiconductor device in accordance with another embodiment of the present disclosure.
Figure 28:
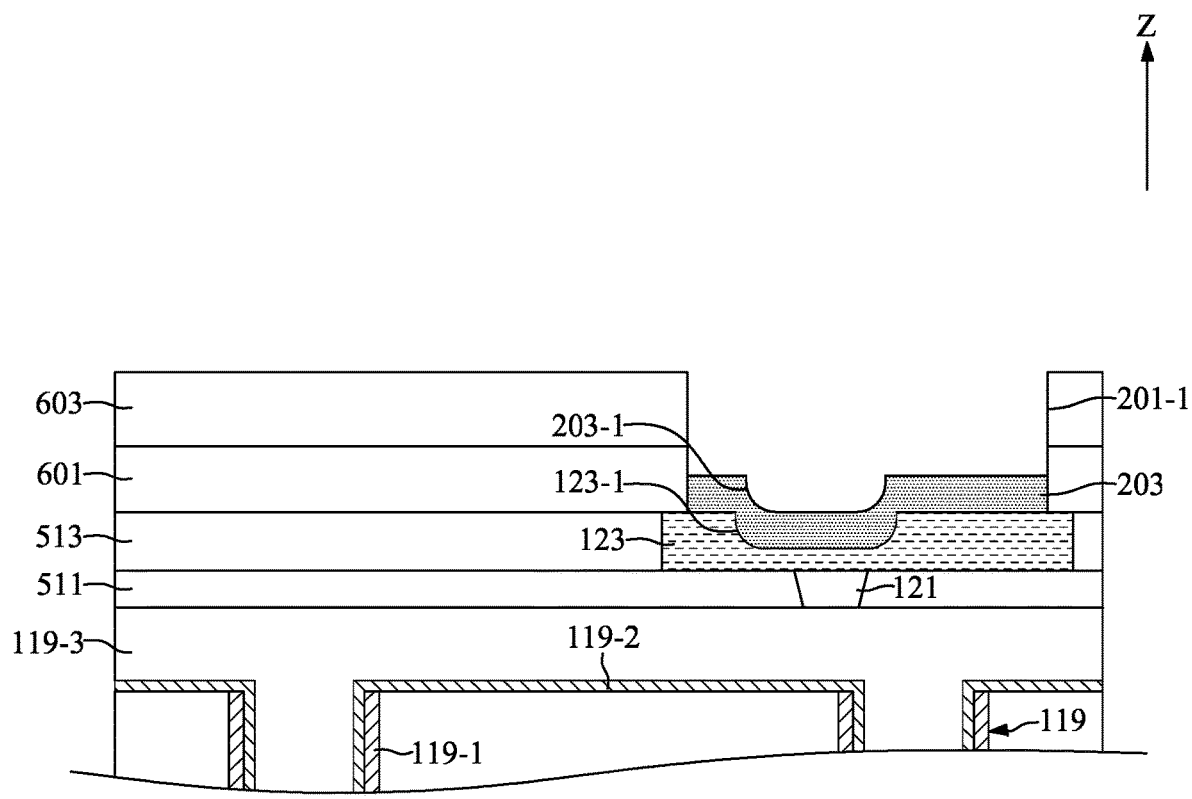
Figure 29:
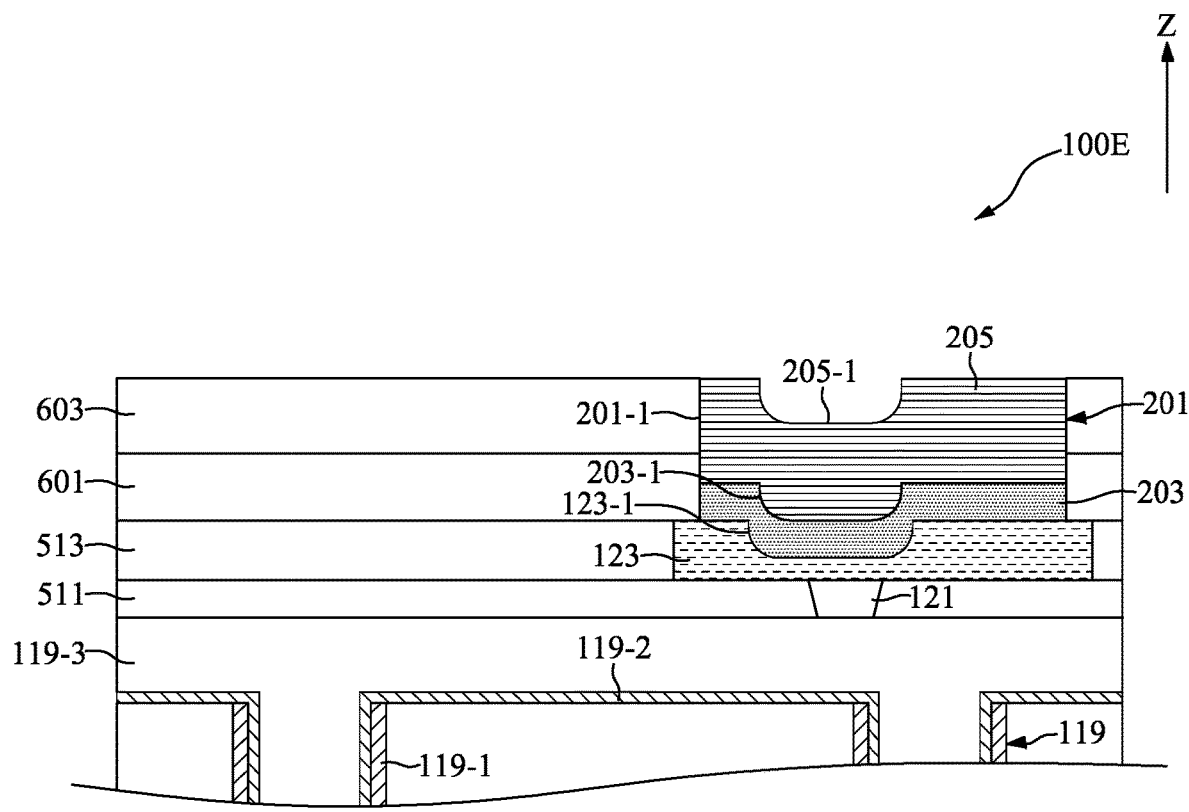

FIGS. 27 to 29 illustrate, in schematic cross-sectional diagrams, part of a flow of fabricating a semiconductor device 100E in accordance with another embodiment of the present disclosure.

With reference to FIG. 27, an intermediate semiconductor device may be fabricated by a procedure similar to that illustrated in FIGS. 15 to 20. A photolithography process may be performed to define a position of the first base groove 123-1. After the photolithography process, an etch process, such as an anisotropic dry etch process, may be performed on the first base groove 123-1 on the top surface of the first conductive layer 123. The cleaning process 701 and the passivation process 703 may be performed after formation of the first base groove 123-1.

With reference to FIG. 28, the first bottom pad 203 may be formed on the first conductive layer 123 and the first base groove 123-1 by electroplating or electroless plating. Due to the presence of the first base groove 123-1, a portion of the first bottom pad 203 may sink into the first base groove 123-1 and concurrently form a first bottom groove 203-1 on a top surface of the first bottom pad 203. With reference to FIG. 29, the first top pad 205 may be formed on the first bottom pad 203 and the first bottom groove 203-1 by electroplating or electroless plating. Due to the presence of the first bottom groove 203-1, a portion of the first top pad 205 may sink into the first bottom groove 203-1 and concurrently form a first top groove 205-1 on a top surface of the first top pad 205.

Figure 30:
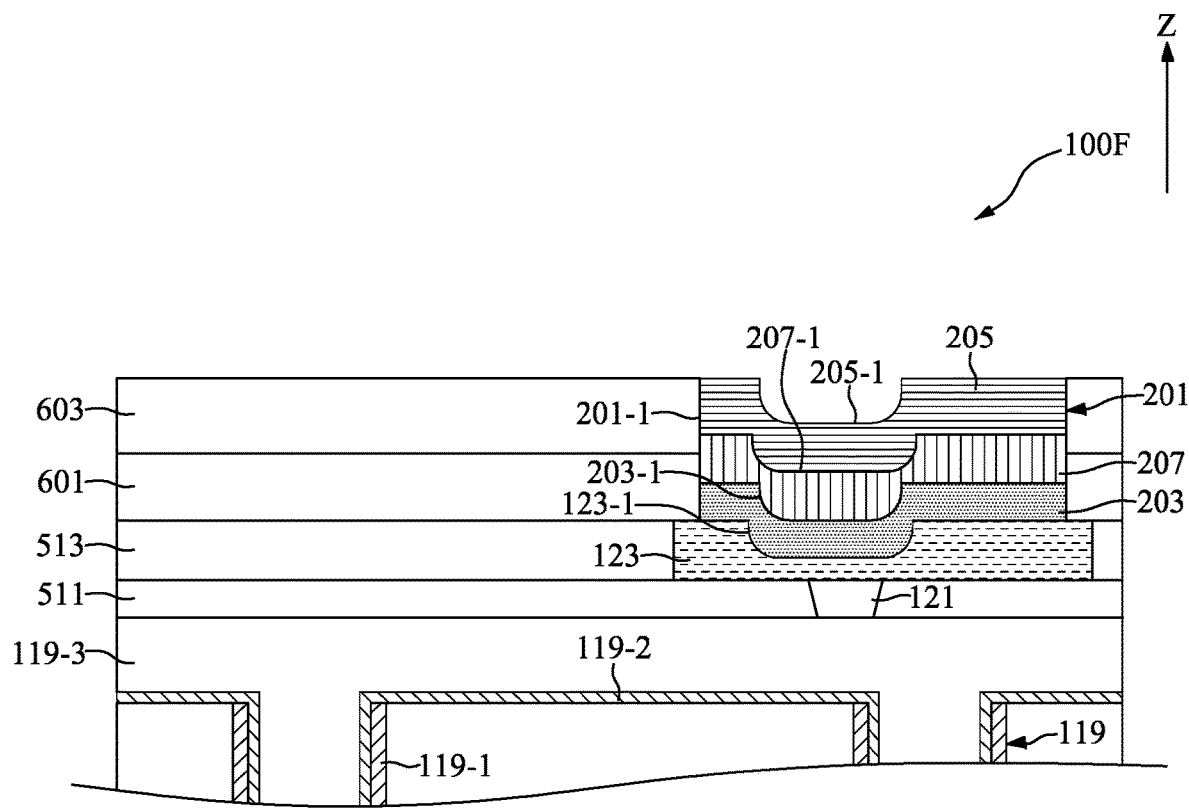
FIG. 30 illustrates, in a schematic cross-sectional diagram, part of a flow of fabricating a semiconductor device in accordance with another embodiment of the present disclosure.

FIG. 30 illustrates, in a schematic cross-sectional diagram, part of a flow of fabricating a semiconductor device 100F in accordance with another embodiment of the present disclosure.

With reference to FIG. 30, an intermediate semiconductor device may be fabricated by a procedure similar to that illustrated in FIGS. 27 and 28. A first middle pad 207 may be formed on the first bottom pad 203 and the first bottom groove 203-1 by electroplating or electroless plating. Due to the presence of the first bottom groove 203-1, a portion of the first middle pad 207 may sink into the first bottom groove 203-1 and concurrently form a first middle groove 207-1 on a top surface of the first middle pad 207. A first top pad 205 may be formed on the first middle pad 207 and the first middle groove 207-1 by electroplating or electroless plating. Due to the presence of the first middle groove 207-1, a portion of the first top pad 205 may sink into the first middle groove 207-1 and concurrently form a first top groove 205-1 on a top surface of the first top pad 205.

Figure 31:
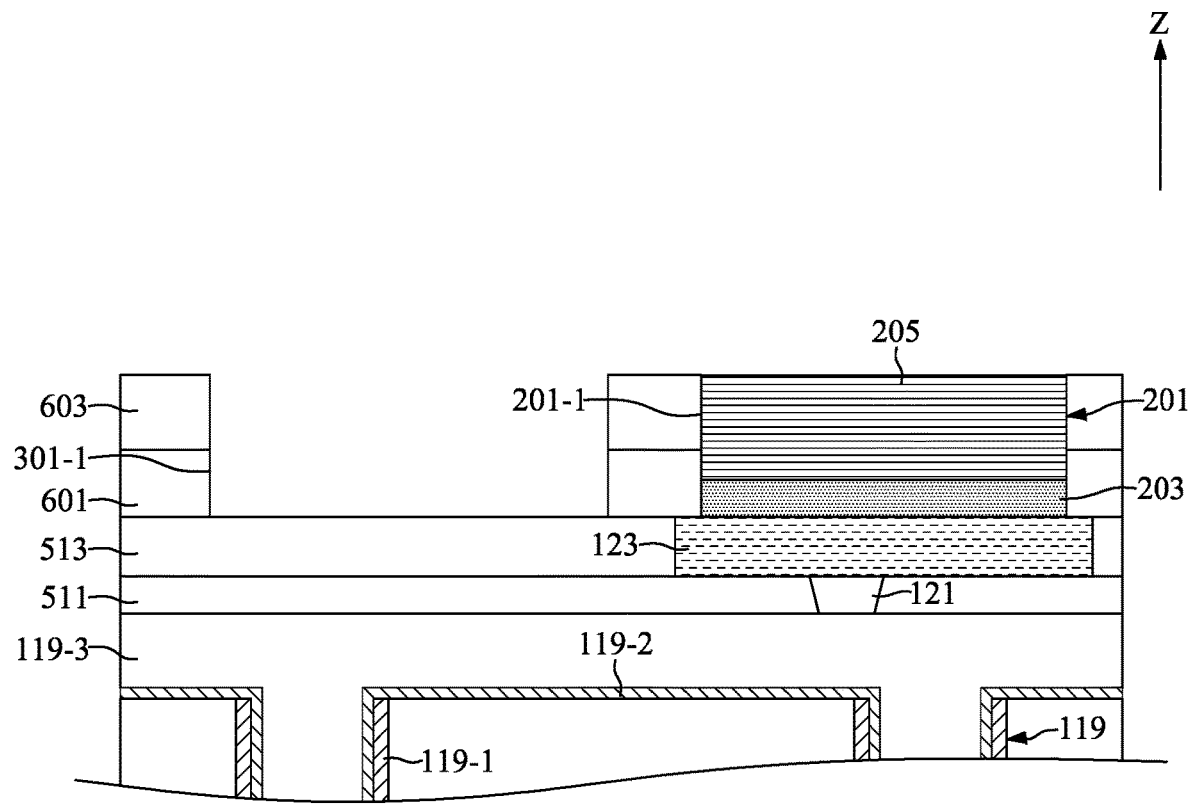
FIG. 31 illustrates, in a schematic cross-sectional diagram, part of a flow of fabricating a semiconductor device in accordance with another embodiment of the present disclosure.
Figure 32:
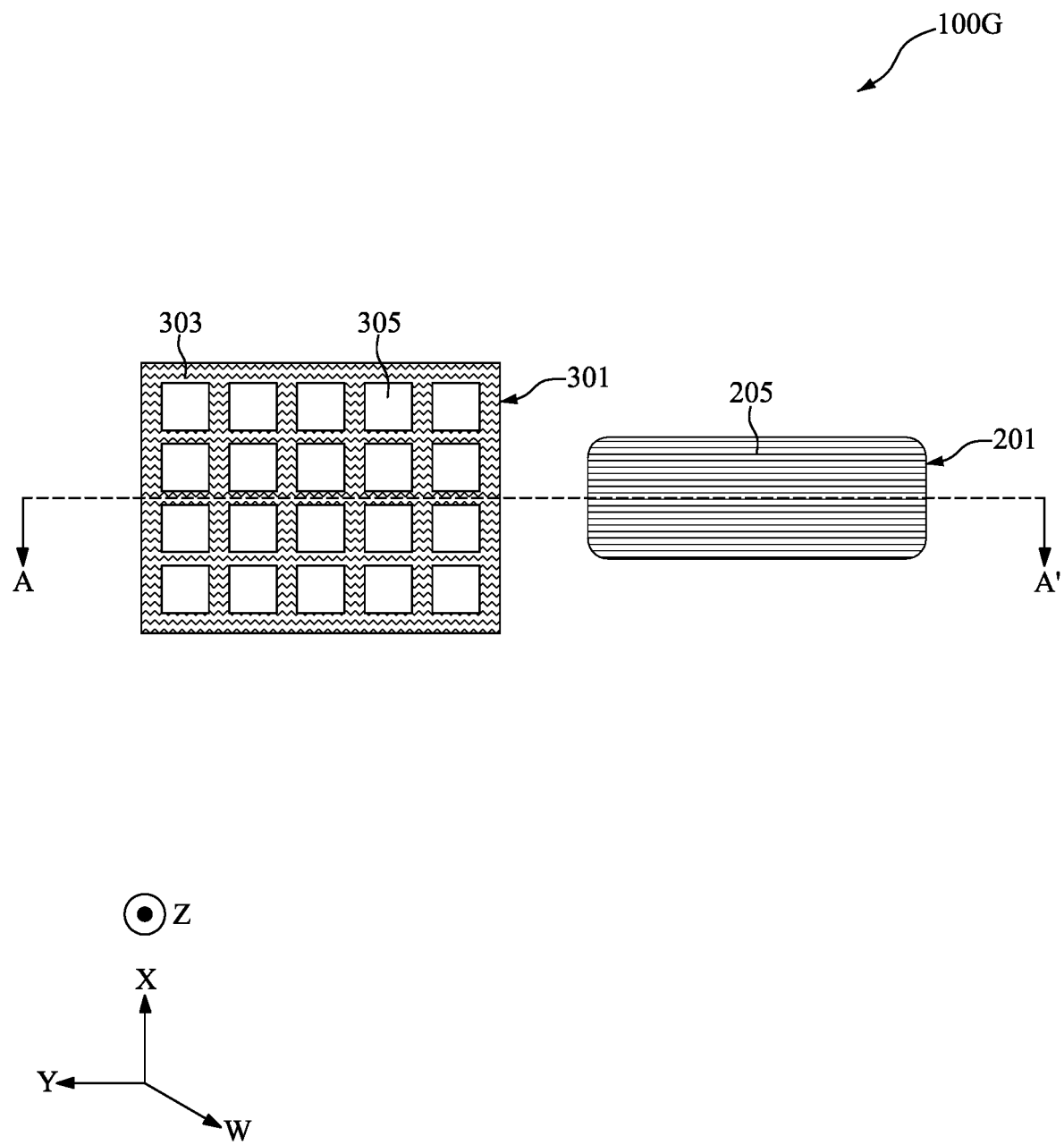
FIG. 32 illustrates, in a schematic top-view diagram, an intermediate semiconductor device of the semiconductor device in accordance with another embodiment of the present disclosure.
Figure 33:
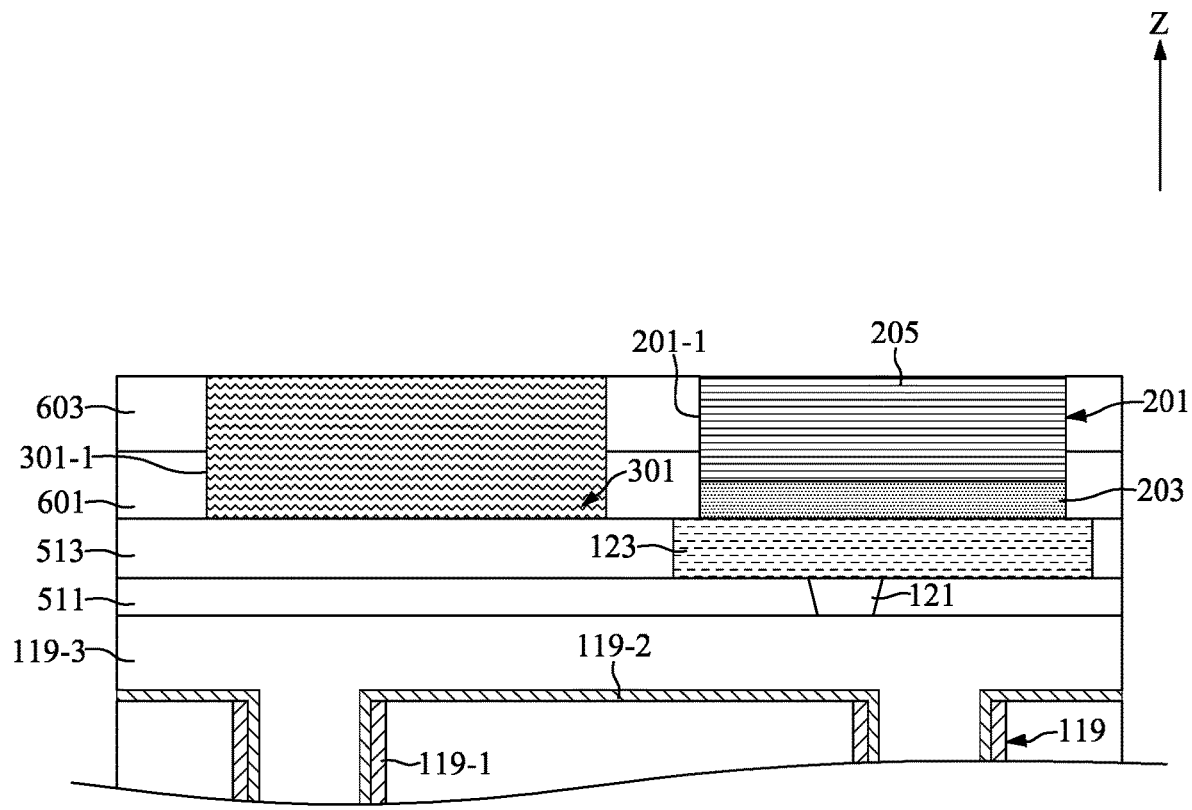
FIG. 33 is a schematic cross-sectional diagram taken along a line A-A' in FIG. 32.
Figure 34:
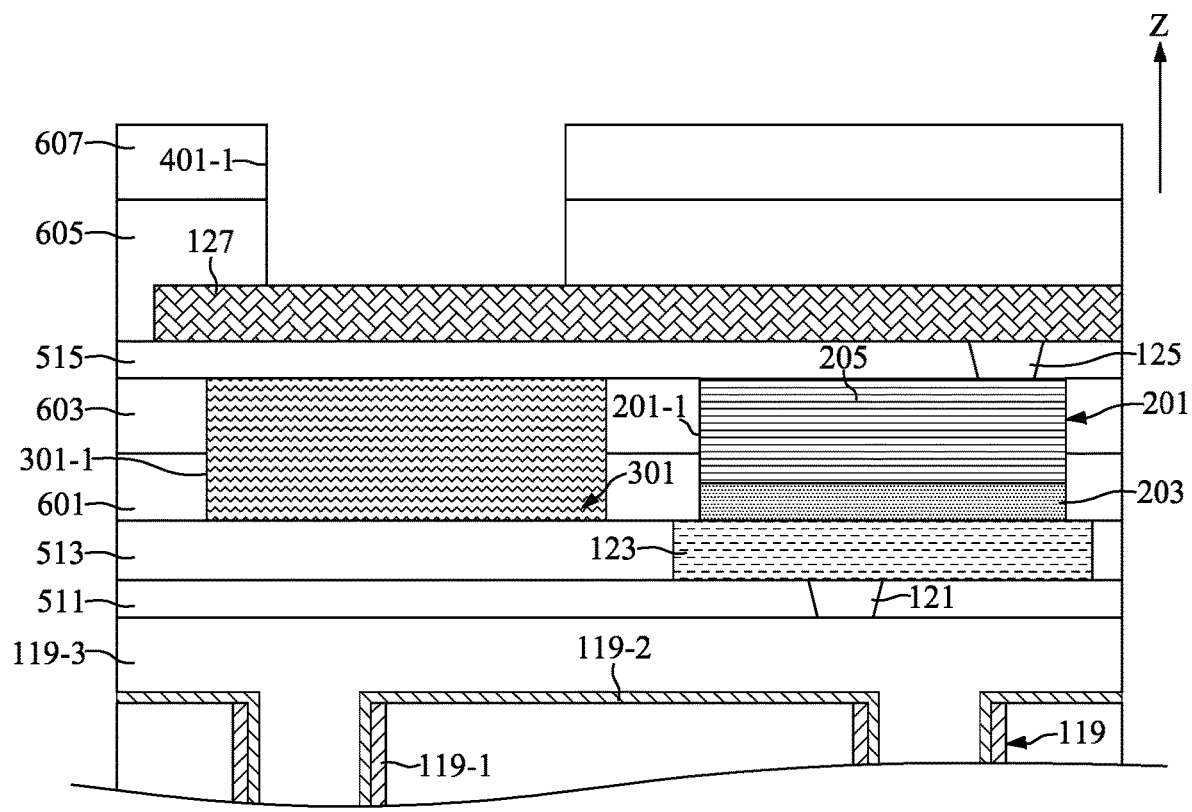
FIGS. 34 to 36 illustrate, in schematic cross-sectional diagrams, part of the flow of fabricating the semiconductor device in accordance with another embodiment of the present disclosure.
Figure 35:
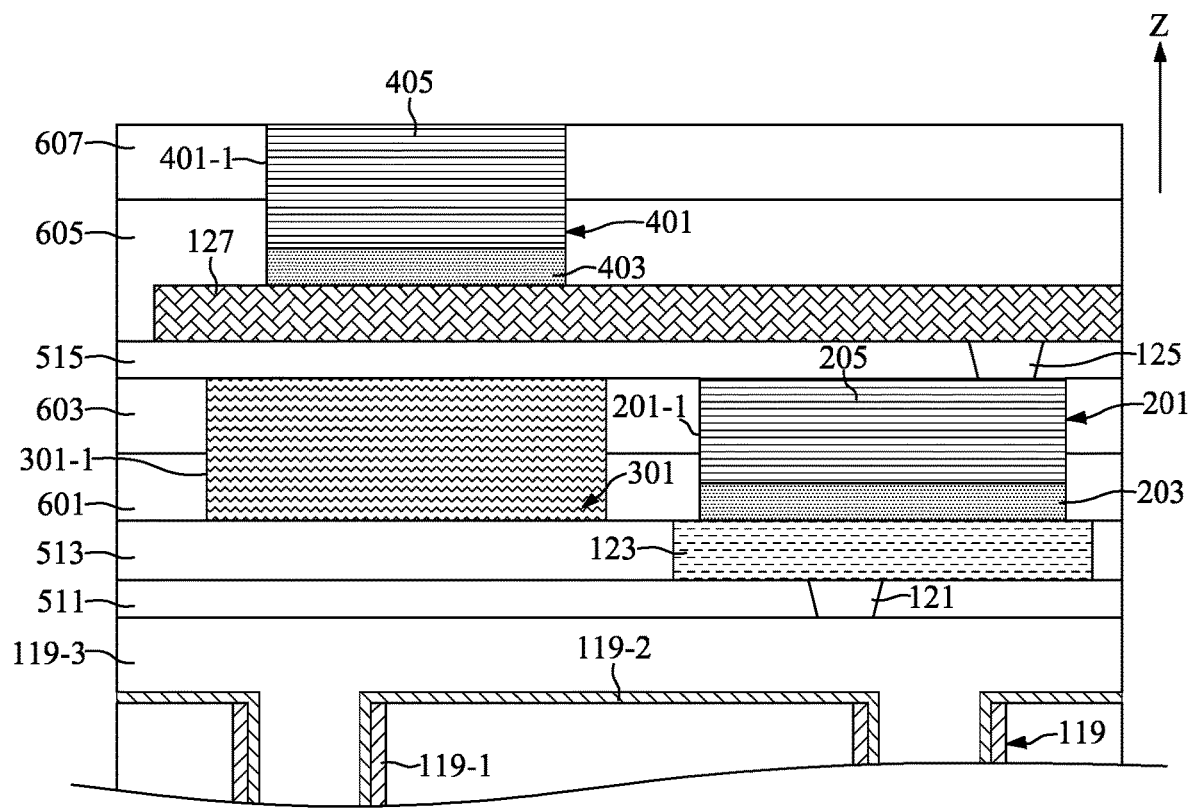
Figure 36:
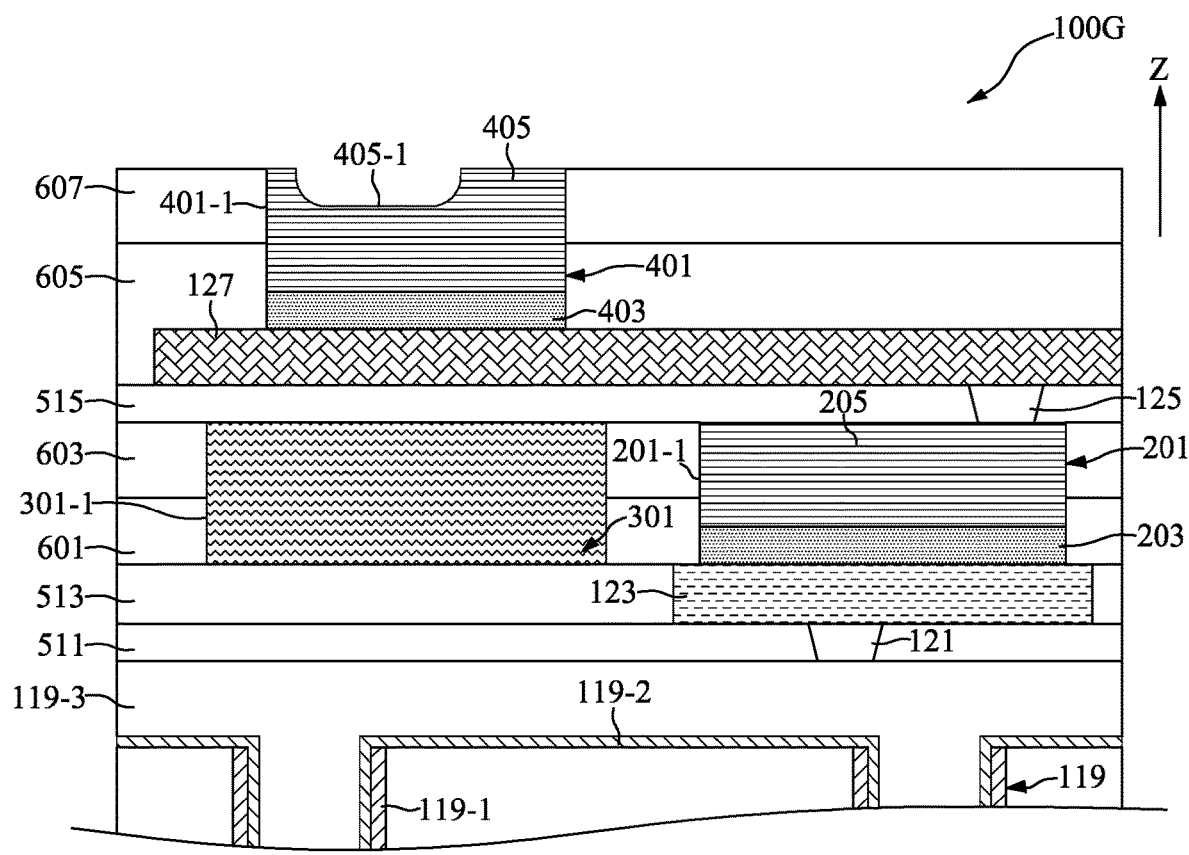

FIG. 31 illustrates, in a schematic cross-sectional diagram, part of a flow of fabricating a semiconductor device 100G in accordance with another embodiment of the present disclosure. FIG. 32 illustrates, in a schematic top-view diagram, an intermediate semiconductor device of the semiconductor device 100G in accordance with another embodiment of the present disclosure. FIG. 33 illustrates part of the flow of fabricating the semiconductor device 100G in accordance with another embodiment of the present disclosure in a schematic cross-sectional diagram taken along a line A-A' in FIG. 32. Some elements of the semiconductor device 100G of the present disclosure are not shown in FIG. 32 for clarity. FIGS. 34 to 36 illustrate, in schematic cross-sectional diagrams, part of the flow of fabricating the semiconductor device 100G in accordance with another embodiment of the present disclosure.

With reference to FIG. 31, an intermediate semiconductor device may be fabricated by a procedure similar to that illustrated in FIGS. 15 to 23. A photolithography process may be performed to define a position of a stress relief structure opening 301-1. After the photolithography process, an etch process, such as an anisotropic dry etch process, may be performed to form the stress relief structure opening 301-1 penetrating through the second passivation layer 603 and the first passivation layer 601. The stress relief structure opening 301-1 may be formed distant from the first pad structure 201.

With reference to FIGS. 32 and 33, a stress relief structure 301 may be formed in the stress relief structure opening 301-1. The stress relief structure 301 may include a conductive frame 303 and a plurality of insulating segments 305. Specifically, a conductive layer may be formed to fill the stress relief structure opening 301-1. A first planarization process, such as chemical mechanical polishing, may be performed to expose the top surface of the second passivation layer 603. A photolithography process may be performed to define positions of the plurality of insulating segments 305. After the photolithography process, an etch process, such as an anisotropic dry etch process, may be performed to form a plurality of openings within the conductive layer and concurrently turn the conductive layer into the conductive frame 303. A filling layer may be formed to fill the plurality of openings. A second planarization process, such as chemical mechanical polishing, may be performed to expose the top surface of the second passivation layer 603 and concurrently form the plurality of insulating segments 305.

With reference to FIG. 34, an eighth insulating film 515 may be formed on the second passivation layer 603. A second conductive via 125 may be formed in the eighth insulating film 515 and on the first pad structure 201. A redistribution layer 127 may be formed on the eighth insulating film 515 and on the second conductive via 125. A third passivation layer 605 may be formed on the eighth insulating film 515 and the redistribution layer 127. A planarization process, such as chemical mechanical polishing, may be performed to provide a substantially flat surface for subsequent processing steps. A fourth passivation layer 607 may be formed on the third passivation layer 605. A second pad opening 401-1 may be formed so as to penetrate through the fourth passivation layer 607 and the third passivation layer 605. A portion of a top surface of the redistribution layer 127 may be exposed through the second pad opening 401-1. With reference to FIGS. 35 and 36, a second pad structure 401 including a second top groove 405-1 may be formed by a procedure similar to that illustrated in FIGS. 20 to 24.

Figure 37:
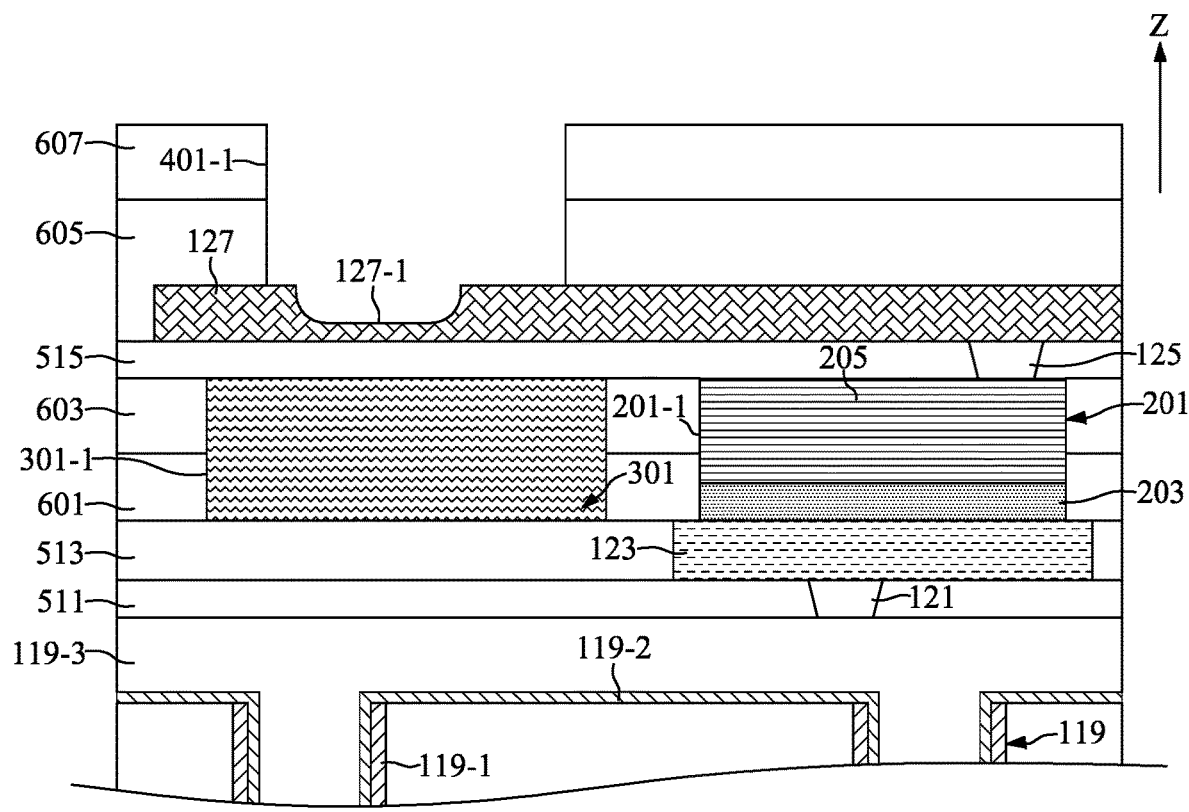
FIGS. 37 and 38 illustrate, in schematic cross-sectional diagrams, part of a flow of fabricating the semiconductor device in accordance with another embodiment of the present disclosure.
Figure 38:
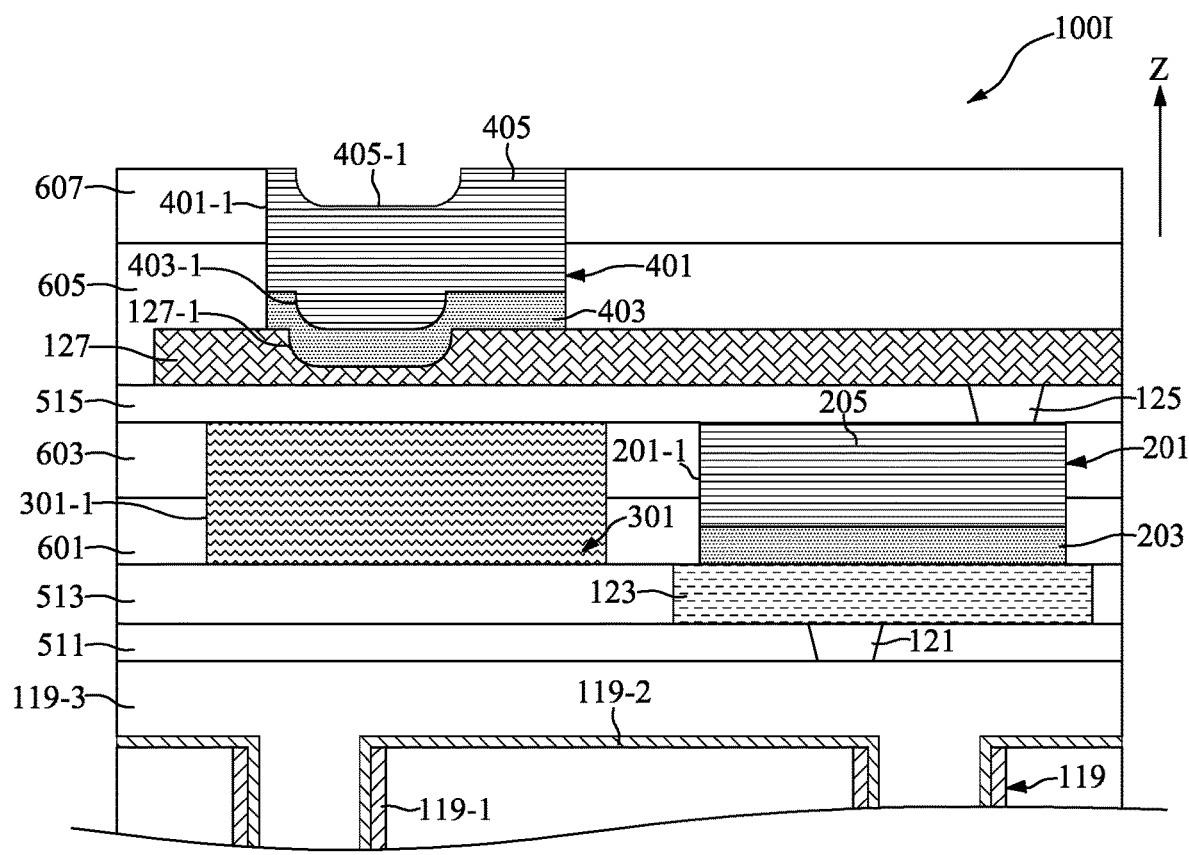

FIGS. 37 and 38 illustrate, in schematic cross-sectional diagrams, part of a flow of fabricating the semiconductor device 100I in accordance with another embodiment of the present disclosure.

With reference to FIG. 37, an intermediate semiconductor device may be fabricated by a procedure similar to that illustrated in FIGS. 31 to 34. A photolithography process may be performed to define a position of a second base groove 127-1 on a top surface of the redistribution layer 127. After the photolithography process, an etch process, such as an anisotropic dry etch process, may be performed to form the second base groove 127-1. The cleaning process 701 and the passivation process 703 may be performed after the formation of the second base groove 127-1. With reference to FIG. 38, a second bottom pad 403, a second bottom groove 403-1, a second top pad 405, and a second top groove 405-1 may be sequentially formed by a procedure similar to that illustrated in FIGS. 27 to 29.

Due to the design of the semiconductor device of the present disclosure, the first top groove 205-1 or the second top groove 405-1 may serve as a guide for a probe tip to prevent the slipping probe tip from moving out of the first top groove 205-1 or the second top groove 405-1. Therefore, even if the slippage of the probe tip occurs, the surrounding passivation layer may remain intact. As a result, the quality, yield, and performance of the semiconductor device may be improved. In addition, the passivation process 703 may reduce undesirable sidewall growth of the plurality of passivation layers. Furthermore, the stress relief structure 301 may distribute a stress of a wiring process; therefore, the delamination of the plurality of insulating films or the plurality of passivation layers may be reduced. As a result, the yield of the semiconductor device may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
    providing a substrate;
    forming a pad structure above the substrate, wherein the step of forming the pad structure above the substrate comprises: forming a bottom pad above the substrate; and forming a top pad on the bottom pad;
    forming a top groove on a top surface of the pad structure, wherein the top groove is formed on a top surface of the top pad;
    forming a redistribution layer above the substrate, wherein the pad structure is positioned on the redistribution layer, wherein the step of forming the pad structure further comprises a step of forming a bottom pad on the redistribution layer, wherein the top groove is positioned on a top surface of the top pad; and
    forming a base groove positioned on a top surface of the redistribution layer and a bottom groove positioned on a top surface of the bottom pad and directly above the base groove, wherein the bottom pad is positioned on the base groove and the redistribution layer, the top pad is positioned on the bottom groove and the bottom pad, and the top groove is directly above the bottom groove.

2. The method for fabricating the semiconductor device of claim 1, further comprising:
    forming a plurality of passivation layers above the substrate; and
    forming a pad opening penetrating through the plurality of passivation layers;
    wherein the pad structure is formed in the pad opening.

3. The method for fabricating the semiconductor device of claim 2, further comprising:
    performing a passivation process comprising soaking the pad opening with a precursor, wherein the precursor is dimethylaminotrimethylsilane or tetramethylsilane.

4. The method for fabricating the semiconductor device of claim 2, further comprising:
    performing a cleaning process, wherein the cleaning process comprises applying a remote plasma to the pad opening.

5. The method for fabricating the semiconductor device of claim 1, further comprising: forming a bottom groove positioned on a top surface of the bottom pad, wherein the top pad is positioned on the bottom groove and the bottom pad.

6. The method for fabricating the semiconductor device of claim 1, further comprising: forming two spacers attached to two sides of the pad structure.

7. The method for fabricating the semiconductor device of claim 1, wherein the top groove is formed adjacent to an edge of the top surface of the top pad.

8. The method for fabricating the semiconductor device of claim 1, wherein forming the pad structure comprises: forming a middle pad positioned on the bottom pad, and forming the top pad positioned on the middle pad, and the top groove is formed on the top surface of the top pad.

9. The method for fabricating the semiconductor device of claim 8, further comprising: a middle groove positioned on a top surface of the middle pad, wherein the middle pad is positioned on the bottom groove and the bottom pad, and the top pad is positioned on the middle groove and the middle pad.

10. The method for fabricating the semiconductor device of claim 1, wherein a ratio of a depth of the top groove and a thickness of the pad structure is between 1:10 and 1:20.

11. The method for fabricating the semiconductor device of claim 1, wherein a ratio of a depth of the top groove and a thickness of the pad structure is between 1:10 and 1:20.

12. The method for fabricating the semiconductor device of claim 1, further comprising: forming a stress relief structure positioned directly below the pad structure.

13. The method for fabricating the semiconductor device of claim 12, wherein forming a stress relief structure comprises a conductive frame positioned directly below the pad structure and a plurality of insulating segments positioned within the conductive frame.

14. The method for fabricating the semiconductor device of claim 13, further comprising: forming a stress-buffering layer positioned between the stress relief structure and the pad structure, wherein the stress-buffering layer is formed of a material having a coefficient of thermal expansion of less than about 20 ppm/° C. and a Young's Modulus of less than about 15 GPa.

* * * * *